US012772546B2

(12) United States Patent
Yang et al.

(10) Patent No.: US 12,772,546 B2
(45) Date of Patent: Oct. 20, 2026

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Chieh-Ning Yang, Tainan (TW); Nai-Hsin Ting, Tainan (TW); Fang-Ting Kuo, Hsinchu (TW); Ping-Pang Hsieh, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 357 days.

(21) Appl. No.: 18/405,216

(22) Filed: Jan. 5, 2024

(65) Prior Publication Data

US 2025/0089350 A1 Mar. 13, 2025

Related U.S. Application Data

(60) Provisional application No. 63/538,134, filed on Sep. 13, 2023.

(51) Int. Cl.

| | |
|---|---|
| ***H10D 84/80*** | (2025.01) |
| ***H10D 1/47*** | (2025.01) |
| ***H10D 30/01*** | (2025.01) |
| ***H10D 30/60*** | (2025.01) |

(52) U.S. Cl.

CPC ........... *H10D 84/811* (2025.01); *H10D 1/474* (2025.01); *H10D 30/023* (2025.01); *H10D 30/611* (2025.01)

(58) Field of Classification Search

CPC ....... H10D 84/817; H10D 1/47; H10D 64/017

See application file for complete search history.

(56) References Cited

U.S. PATENT DOCUMENTS

| | | | | |
|---|---|---|---|---|
| 9,171,839 | B2 * | 10/2015 | Chern | H10D 1/47 |
| 9,379,175 | B2 | 6/2016 | Chung et al. | |
| 10,727,223 | B2 * | 7/2020 | Yu | H01C 17/14 |
| 11,569,159 | B2 | 1/2023 | Li et al. | |
| 2009/0090977 | A1 * | 4/2009 | Freeman | H10D 1/47 438/383 |
| 2011/0073957 | A1 * | 3/2011 | Chiu | H10D 1/47 257/536 |
| 2012/0217586 | A1 * | 8/2012 | Chern | H10D 1/47 257/E21.616 |

(Continued)

FOREIGN PATENT DOCUMENTS

| | | | | | |
|---|---|---|---|---|---|
| CN | 102013424 | A | * | 4/2011 | H10D 84/856 |
| TW | 1484592 | B | * | 5/2015 | H10D 84/817 |
| TW | 202324502 | A | | 6/2023 | |

*Primary Examiner* — Evren Seven

(74) *Attorney, Agent, or Firm* — NZ Carr Law Office

(57) ABSTRACT

A semiconductor device structure and methods of forming the same are described. The structure includes a first gate structure disposed over a substrate in an active device region, an insulating material disposed over the substrate in a passive device region, a resistor structure disposed over the insulating material in the passive device region, a first conductive contact electrically connected to the resistor structure, a second conductive contact disposed over the resistor structure, and a dielectric layer in contact with the second conductive contact and the resistor structure.

20 Claims, 39 Drawing Sheets

(56) References Cited

U.S. PATENT DOCUMENTS

| | | | | |
|---|---|---|---|---|
| 2013/0140641 | A1* | 6/2013 | Chuang | H10D 1/47<br>257/369 |
| 2014/0319620 | A1* | 10/2014 | Hoentschel | H10D 1/47<br>257/379 |
| 2019/0164957 | A1* | 5/2019 | Meng | H10B 12/03 |
| 2021/0013197 | A1 | 1/2021 | Yu et al. | |

* cited by examiner

SEMICONDUCTOR DEVICE STRUCTURE AND METHODS OF FORMING THE SAME

CROSS-REFERENCE TO RELATED APPLICATIONS

This application claims priority to U.S. Provisional Application No. 63/538,134, filed on Sep. 13, 2023, the contents of which are hereby incorporated by reference in their entirety.

BACKGROUND

The semiconductor integrated circuit (IC) industry has experienced exponential growth. Technological advances in IC materials and design have produced generation of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs.

Accompanying the scaling down of devices, manufacturers have begun using new and different materials and/or combination of materials to facilitate the scaling down of devices. Scaling down, alone and in combination with new and different materials, has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
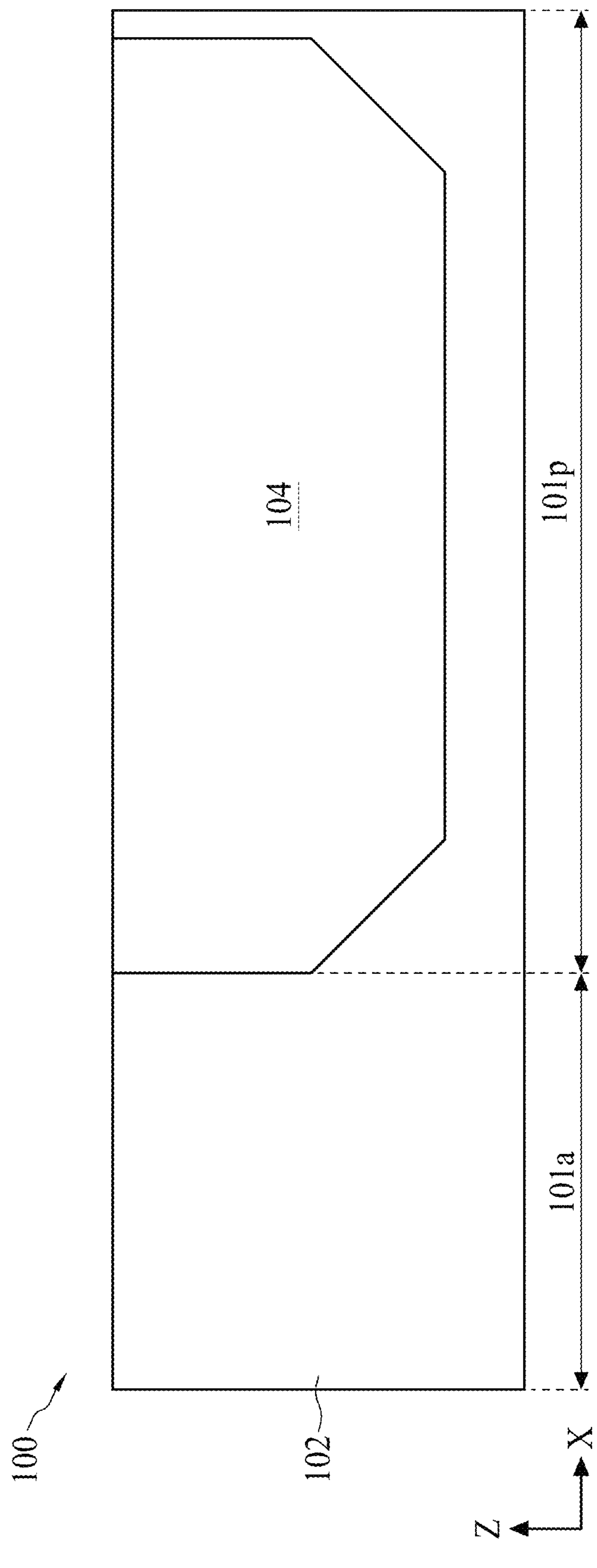
FIGS. 1-18 illustrate cross-sectional side views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure relates to a resistor structure that can be integrated in front-end-of-line (FEOL) with active devices, such as field effect transistors (FETs). In some embodiments, the resistor structure includes a semiconductor material, and one or more conductive contacts are disposed over, in, or through the semiconductor material. The one or more conductive contacts can function as tuning electrodes to provide a bias to tune the resistance of the resistor structure.

Some variation of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein. In some figures, some reference numbers of components or features illustrated therein may be omitted to avoid obscuring other components or features; this is for ease of depicting the figures.

FIGS. 1 through 18 illustrate cross-sectional side views of various stages of manufacturing a semiconductor device structure 100, in accordance with some embodiments. The semiconductor device structure 100, as described in the following, is used in the implementation of planar FETs. Other device structures, such as FinFETs, Horizontal Gate All Around (HGAA) FETs, Vertical Gate All Around (VGAA) FETs, nanosheet FETs, nanowire FETs, forksheet FETs, complementary FETs (CFETs) may be implemented in other example embodiments.

As shown in FIG. 1, the semiconductor device structure 100 includes a substrate 102. The substrate 102 may be a semiconductor substrate. The substrate 102 may include a crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In some embodiments, the substrate 102 is a silicon-on-insulator (SOI) substrate having an insulating layer (not shown) disposed between two silicon layers for enhancement. In one aspect, the insulating layer is an oxygen-containing layer.

The substrate 102 may include various regions that have been doped with impurities (e.g., dopants having p-type or n-type conductivity). Depending on circuit design, the dopants may be, for example phosphorus for an n-type field effect transistors (NFET) and boron for a p-type field effect transistors (PFET).

An insulating material 104 is formed in the substrate 102, as shown in FIG. 1. The insulating material 104 may be made of silicon oxide, silicon nitride, silicon oxynitride (SiON), SiOCN, SiCN, fluorine-doped silicate glass (FSG), a low-K dielectric material, or any suitable dielectric material. The insulating material 104 may be formed by any suitable method, such as low-pressure chemical vapor deposition (LPCVD), plasma enhanced CVD (PECVD) or flowable CVD (FCVD). In some embodiments, openings are formed in the substrate 102, and the insulating material 104 is formed in the openings. A planarization process, such as a chemical mechanical polishing process, may be performed to remove portions of the insulating material 104 formed on the substrate 102. The insulating material 104 is an isolation region, such as a shallow trench isolation (STI) region.

As shown in FIG. 1, the semiconductor device structure 100 includes an active device region 101*a* and a passive device region 101*p*. Active devices, such as FETs, may be formed in the active device region 101*a*, while passive devices, such as resistors or capacitors, may be formed in the passive device region 101*p*.

Figure 2:
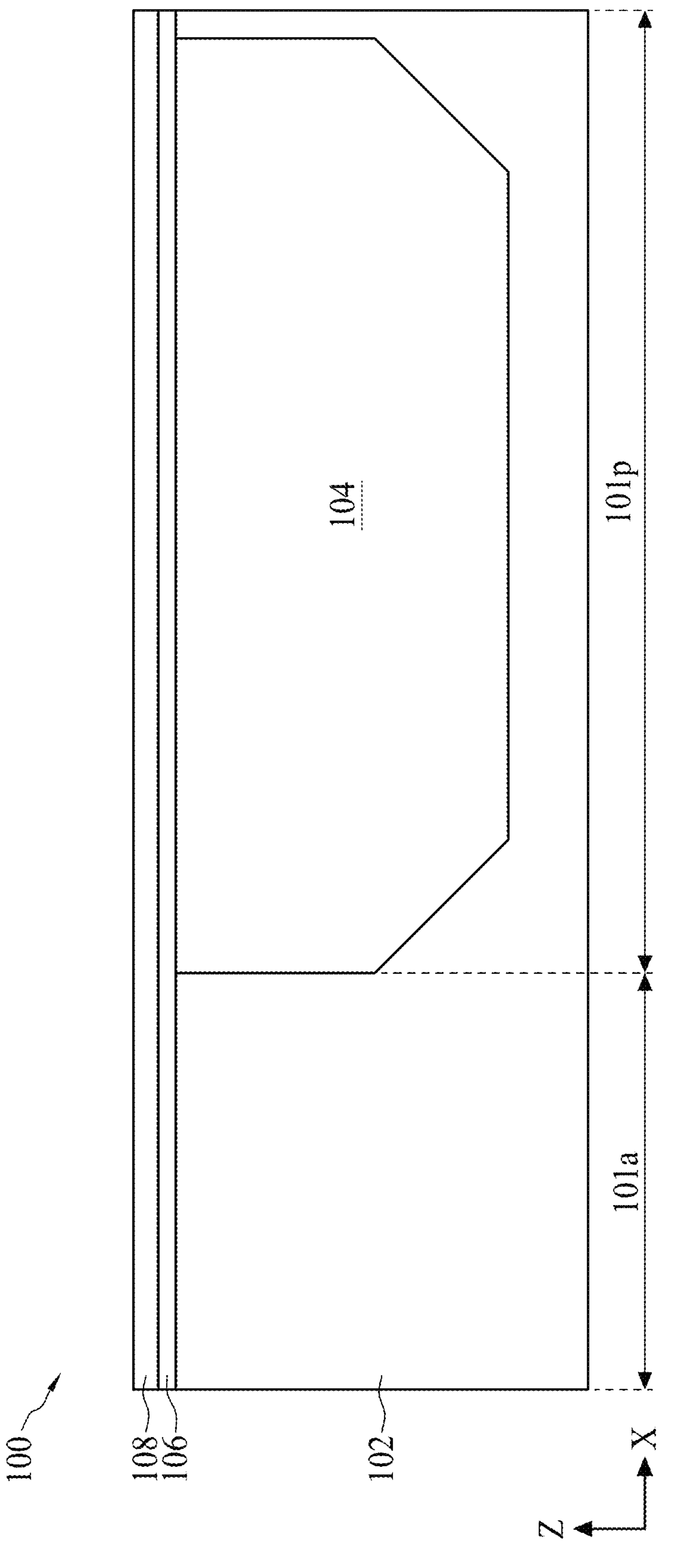

As shown in FIG. 2, a dielectric layer 106 is formed on the substrate 102 and the insulating material 104. The dielectric layer 106 may include any suitable dielectric material. In some embodiments, the dielectric layer 106 includes a high-K dielectric material. Examples of high-K dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-K dielectric materials, and/or combinations thereof. The dielectric layer 106 may be formed by CVD, ALD, or any suitable deposition technique. A metal-containing layer 108 is formed on the dielectric layer 106. In some embodiments, the metal-containing layer is a nitride, such as a TiN or TaN. The metal-containing layer 108 may be formed by physical vapor deposition (PVD), CVD, ALD, or any suitable deposition technique.

Figure 3:
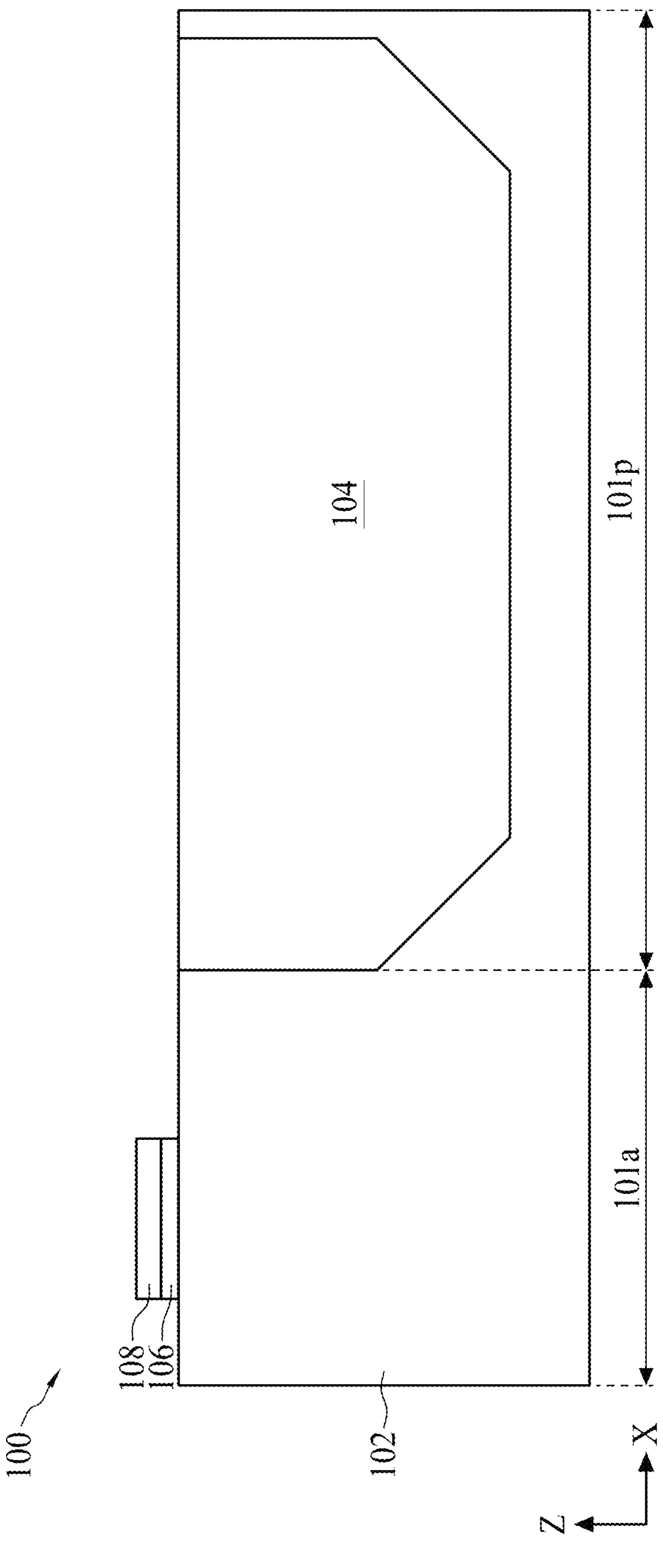

As shown in FIG. 3, the dielectric layer 106 and the metal-containing layer 108 are patterned. In some embodiments, the portion of the dielectric layer 106 and the metal-containing layer 108 located in the passive device region 101*p* is removed. A patterned mask layer (not shown) may be formed on the metal-containing layer 108, and the pattern of the patterned mask layer is transferred to the metal-containing layer 108 and the dielectric layer 106. The patterning of the dielectric layer 106 and the metal-containing layer 108 may include photo-lithography process and one or more etching processes.

Figure 4:
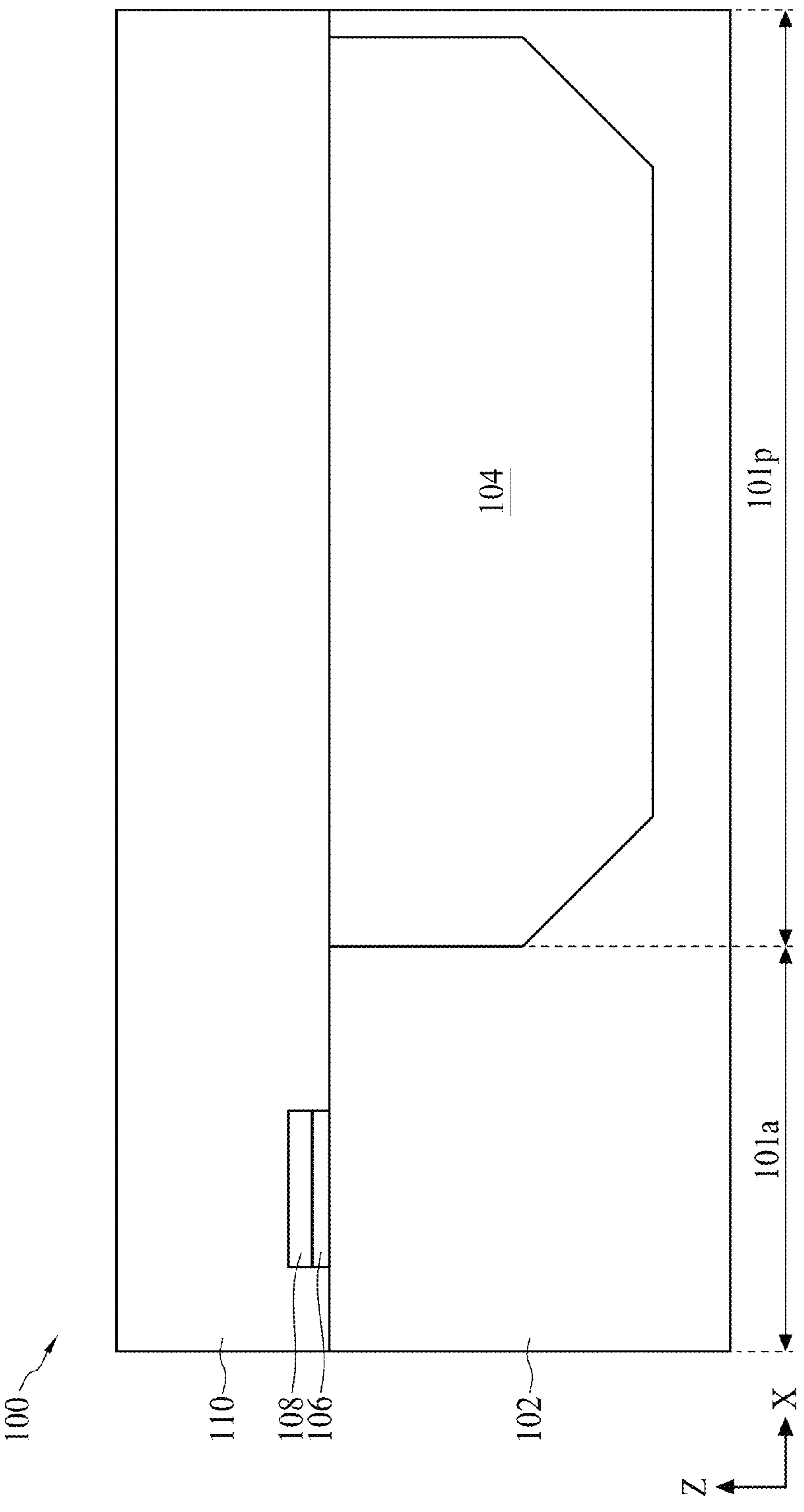

As shown in FIG. 4, a semiconductor material 110 is deposited on the substrate 102, the metal-containing layer 108, and the insulating material 104. In some embodiments, the semiconductor material 110 covers sidewalls of the dielectric layer 106 and the metal-containing layer 108. The semiconductor material 110 may include any suitable semiconductor material. In some embodiments, the semiconductor material 110 includes doped or undoped polycrystalline silicon (polysilicon). The semiconductor material 110 may be formed by any suitable processes, such as CVD (including both LPCVD and PECVD), PVD, or ALD.

Figure 5:
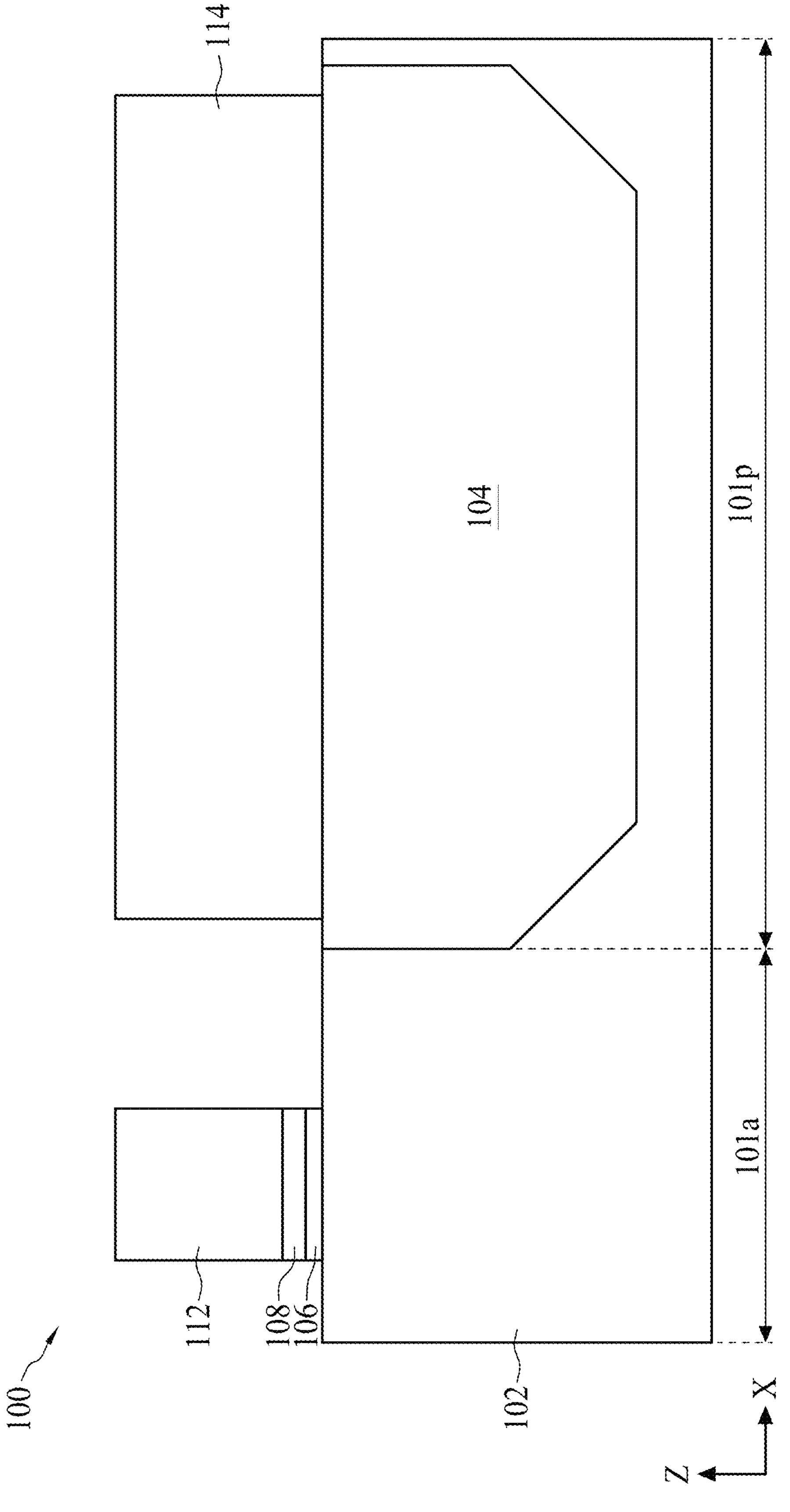

As shown in FIG. 5, the semiconductor material 110 is patterned to form a sacrificial gate electrode 112 and a resistor structure 114. A patterned mask layer (not shown) may be formed on the semiconductor material 110, and the pattern of the patterned mask layer is transferred to the semiconductor material 110. The patterning of the semiconductor material 110 may include photo-lithography process and one or more etching processes. As a result of the patterning process, the sacrificial gate electrodes 112 are formed in the active device region 101*a*, and the resistor structure 114 is formed in the passive device region 101*p*. In some embodiments, as shown in FIG. 5, the sidewall of the sacrificial gate electrode 112 may be aligned with the sidewalls of the dielectric layer 106 and the metal-containing layer 108.

Figure 6:
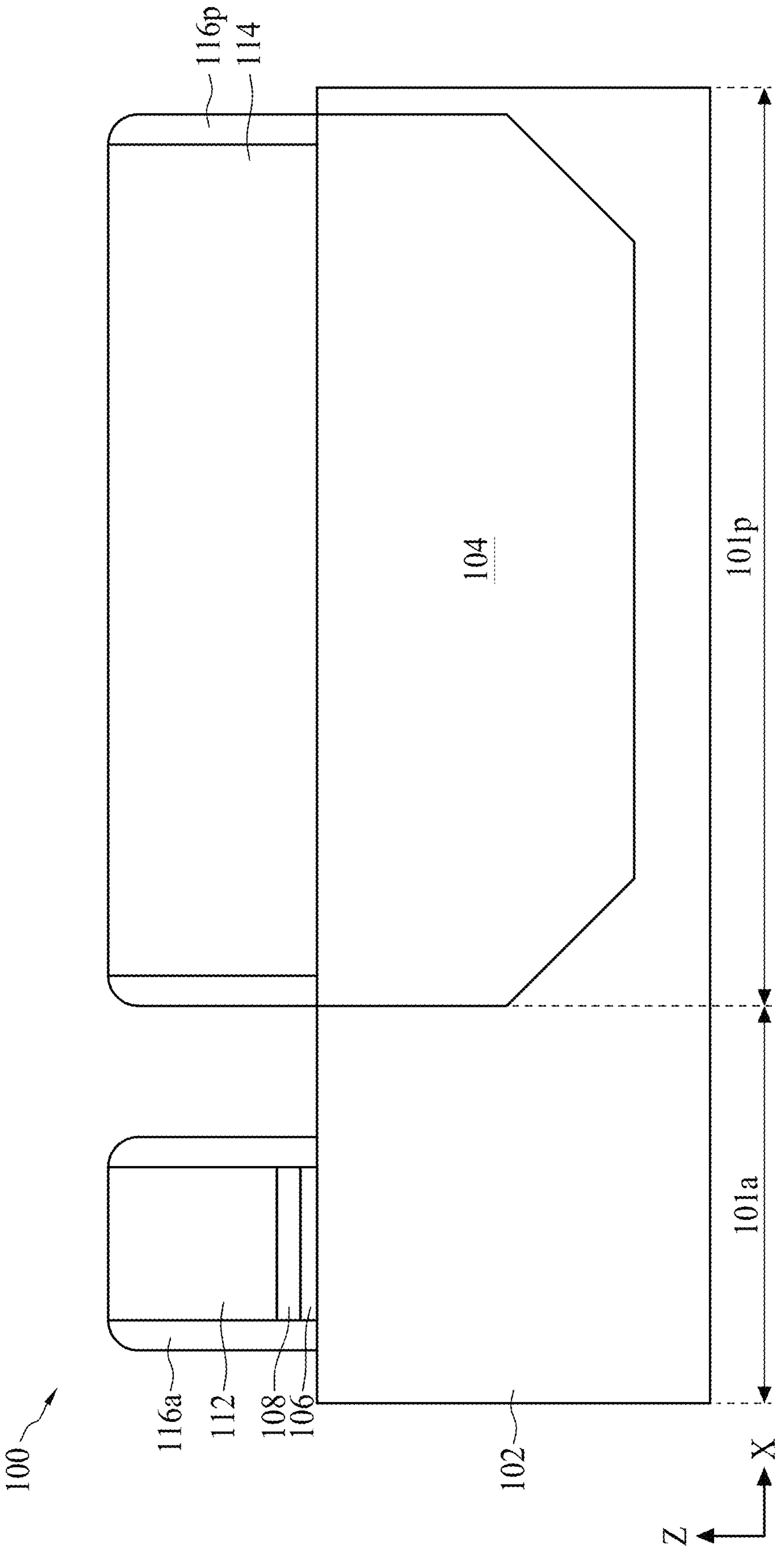

As shown in FIG. 6, spacers 116*a* are formed on sidewalls of the sacrificial gate electrode 112, the metal-containing layer 108, and the dielectric layer 106 in the active device region 101*a*, and spacers 116*p* are formed on sidewalls of the resistor structure 114. The spacers 116*a* and the spacers 116*p* may include one or more dielectric layers. The material of the spacers 116*a* and the spacers 116*p* may include silicon oxide ($SiO_2$), silicon nitride ($Si_3N_4$), silicon carbide (SiC), silicon oxynitride (SiON), silicon carbon-nitride (SiCN), silicon oxycarbide (SiOC), silicon oxycarbonitride (SiOCN), any combinations thereof, or any suitable dielectric material. In some embodiments, a conformal dielectric layer is formed on the exposed surfaces of the semiconductor device structure 100, and an anisotropic etch process is performed on the dielectric layer to remove portions of the dielectric layer formed on horizontal surfaces of the semiconductor device structure 100. The remaining portions of the dielectric layer formed on the vertical surfaces of the semiconductor device structure 100 become the spacers 116*a* and spacers 116*p*.

Figure 7:
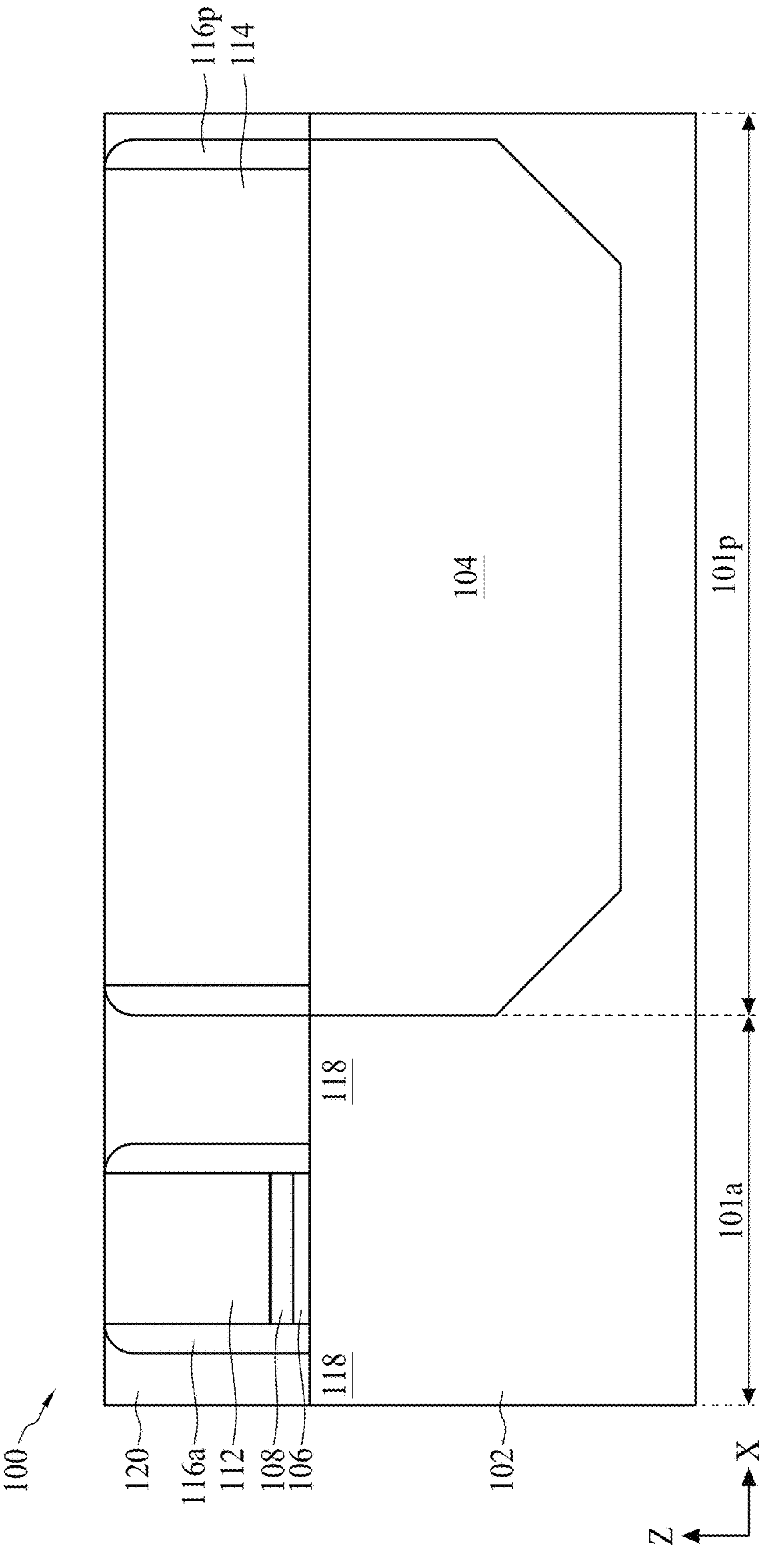

As shown in FIG. 7, source/drain (S/D) regions 118 are formed in the substrate 102, and an interlayer dielectric (ILD) layer 120 is formed over the S/D regions 118. The S/D regions 118 may be formed by doping the exposed portions of the substrate 102. N-type dopants, such as phosphorus (P) or arsenic (As), or p-type dopants, such as boron (B), may be used to form the S/D regions 118. In some embodiments, n-type FETs and p-type FETs may be formed at different times, and a mask layer (not shown) may be used. In this disclosure, a source region and a drain region are interchangeably used, and the structures thereof are substantially the same. Furthermore, source/drain region(s) may refer to a source or a drain, individually or collectively dependent upon the context.

The ILD layer 120 may be formed over the S/D regions 118. The ILD layer 120 may include or be silicon dioxide, a low-k dielectric material (e.g., a material having a dielectric constant lower than silicon dioxide), silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, spin-on-glass, spin-on-polymers, silicon carbon material, a compound thereof, a composite thereof, the like, or a combination thereof. The ILD layer 120 may be initially formed to embed the sacrificial gate electrode 112 and the resistor structure 114, and a planarization process, such as a CMP process, may be performed to expose the sacrificial gate electrode 112 and the resistor structure 114. In some embodiments, a contact etch stop layer (CESL) (not shown) may be first formed on the S/D regions 118, the spacers 116*a*, 116*p*, the sacrificial gate electrode 112, and the resistor structure 114, and the ILD layer 120 is formed on the CESL. The planarization process may also remove portions of the CESL formed on the top surface of the sacrificial gate electrode 112 and the top surface of the resistor structure 114.

Figure 8:
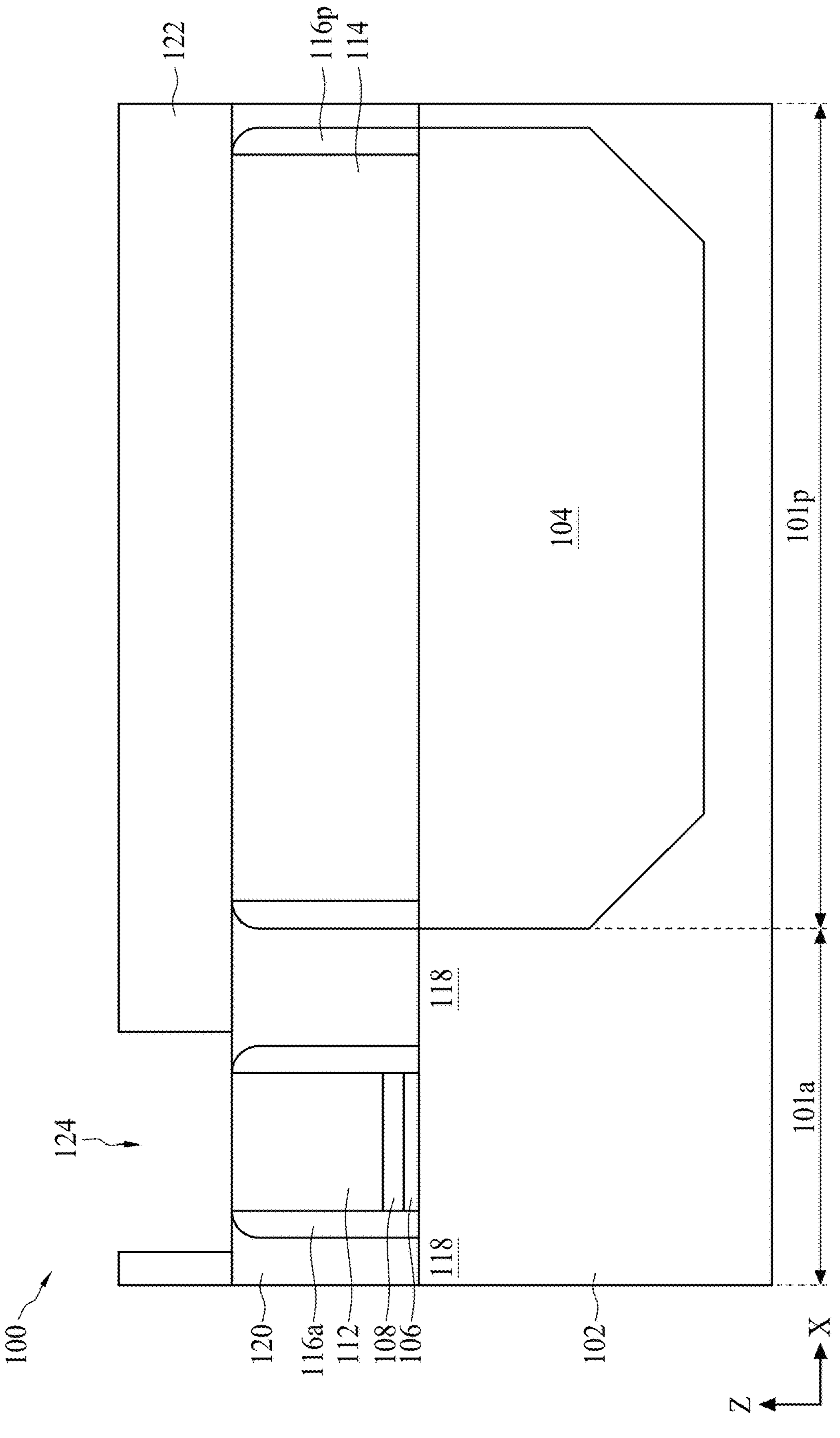

As shown in FIG. 8, a patterned mask layer 122 is formed on the ILD layer 120 and the resistor structure 114. An opening 124 is formed in the patterned mask layer 122, and the sacrificial gate electrode 112 is exposed in the opening 124. In some embodiments, the spacers 116*a* are also exposed in the opening 124, as shown in FIG. 8. The sacrificial gate electrode 112 is then removed by any suitable process. In some embodiments, the sacrificial gate electrode 112 is removed by a dry etch process, a wet etch process, or a combination thereof. The etch process may be a selective etch process that does not substantially affect the spacers 116*a*. The patterned mask layer 122 is removed during or after the removal of the sacrificial gate electrode 112.

Figure 9:
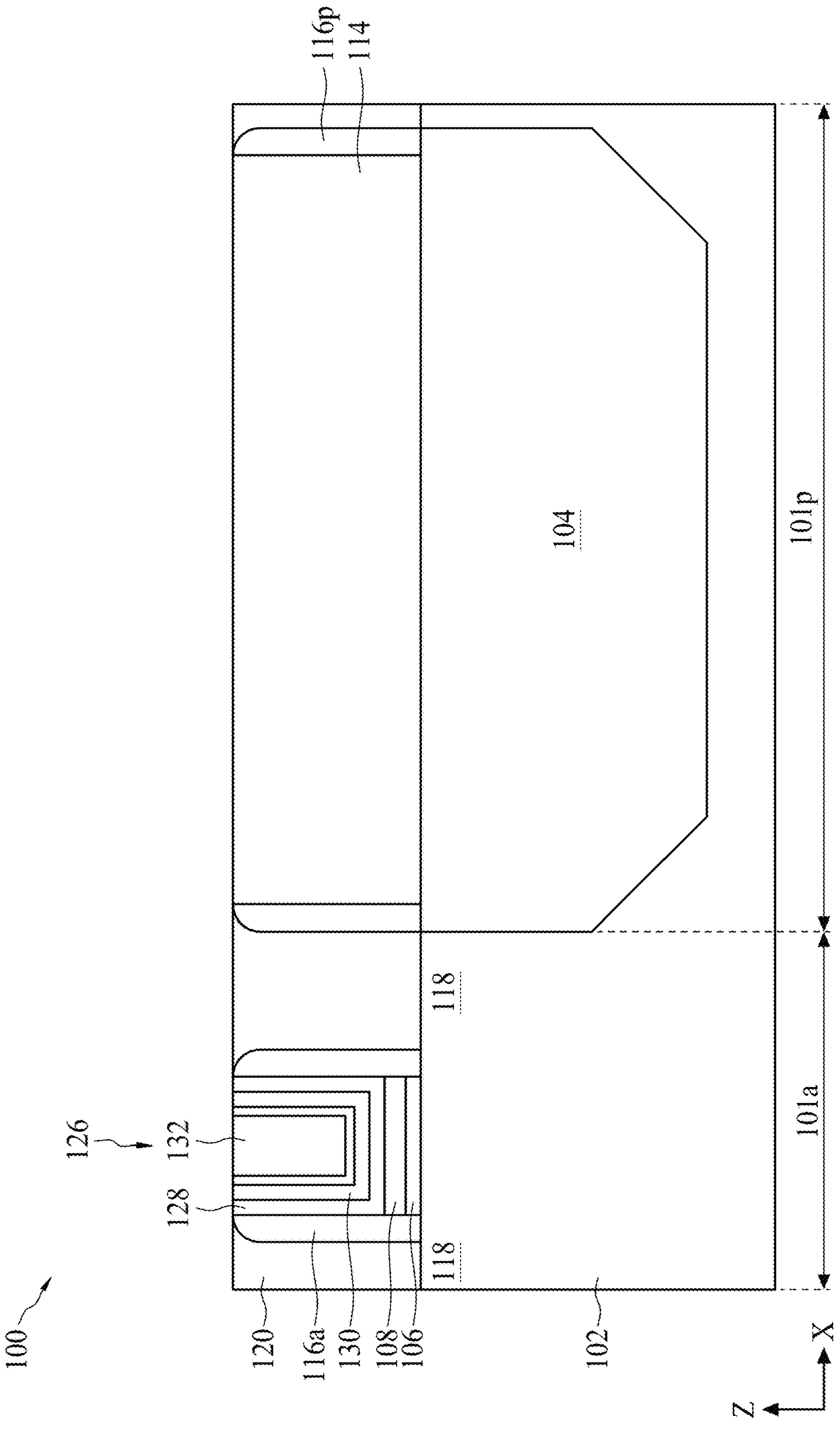

As shown in FIG. 9, a gate structure 126 is formed in the opening formed by the removal of the sacrificial gate electrode 112. The gate structure 126 includes one or more work function layers 128, 130 and a gate electrode 132. The work function layers 128, 130 may include a metallic material, such as platinum (Pt), palladium (Pd), tantalum (Ta), ytterbium (Yb), aluminum (Al), silver (Ag), titanium (Ti), ruthenium (Ru), molybdenum (Mo), chromium (Cr), tungsten (W), copper (Cu), or similar material. The gate electrode 132 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or any combinations thereof. The work function layers 128, 130 and the gate electrode 132 may be formed by CVD, ALD, PVD, electro-plating, or other suitable deposition technique. In some embodiments, the dielectric layer 106 and the metal-containing layer 108 are also part of the gate structure 126. The metal-containing layer 108 may be a work function layer of the gate structure 126, and the dielectric layer 106 may be a gate dielectric layer of the gate structure 126. In some embodiments, the metal-containing layer 108 may not be present. In some embodiments, portions of the work function layers 128, 132 and the gate electrode 132 may be formed on the ILD layer 120 and the resistor structure 114, and a planarization process, such as a CMP process, may be performed to remove the portions of the work function layers 128, 130 and the gate electrode 132 formed on the ILD layer 120 and the resistor structure 114. In some embodiments, a top surface of the resistor structure 114 and a top surface of the gate electrode 132 are substantially co-planar.

Figure 10:
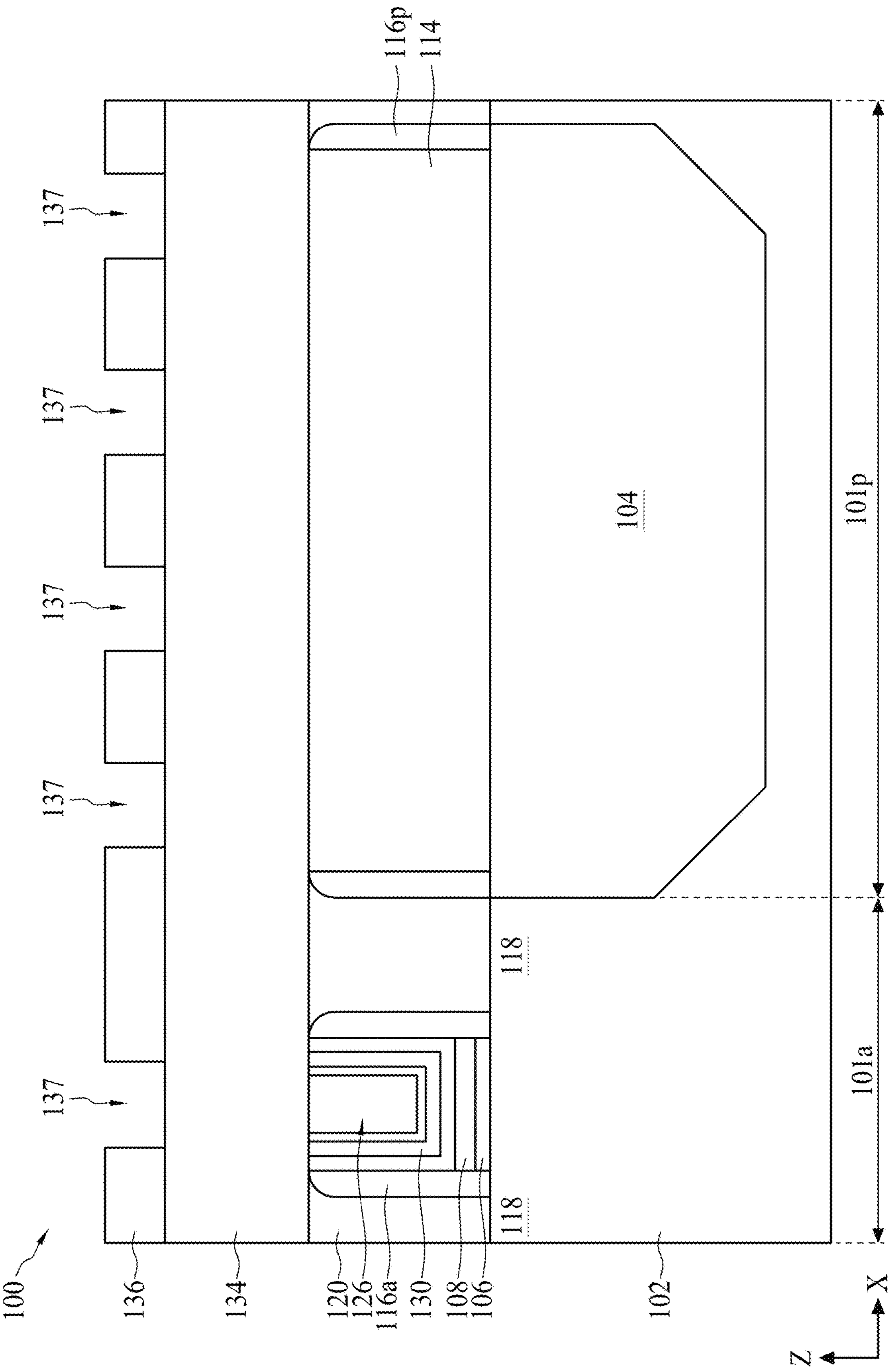

As shown in FIG. 10, a second ILD layer 134 is deposited over the ILD layer 120, the gate structure 126, and the resistor structure 114, and a patterned resist layer 136 is formed on the second ILD layer 134. The second ILD layer 134 may include the same material as the ILD layer 120 and may be formed by the same process as the ILD layer 120. The patterned resist layer 136 may be a photoresist layer including a plurality of openings 137. In some embodiments, an etch stop layer (not shown) may be formed on the ILD layer 120, the gate structure 126, and the resistor structure 114, and the second ILD layer 134 is deposited on the etch stop layer.

Figure 11:
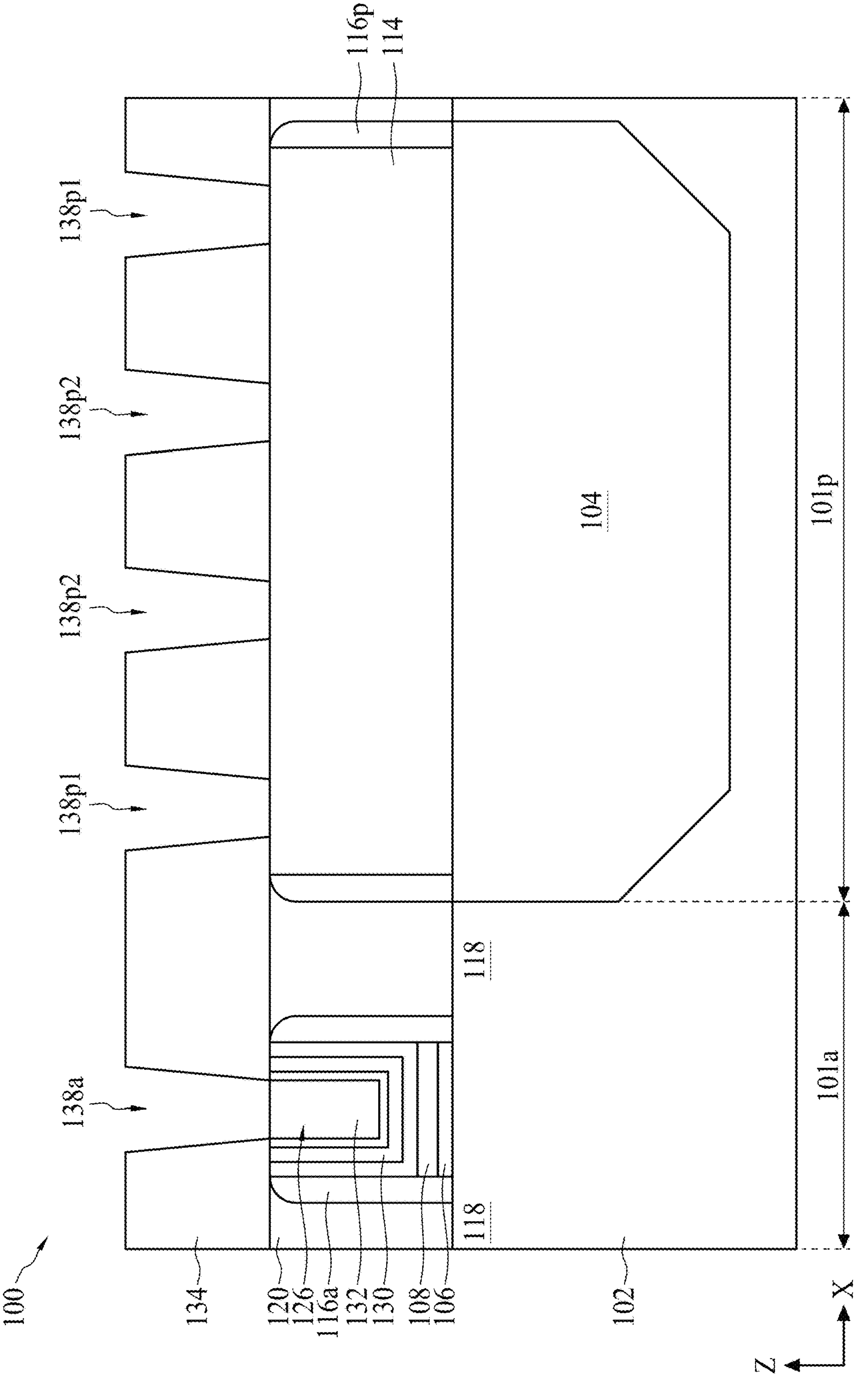

As shown in FIG. 11, the pattern of the patterned resist layer 136 is transferred to the second ILD layer 134, and the patterned resist layer 136 is removed. Openings 138*a*, 138*p*1, 138*p*2 are formed in the second ILD layer 134. The opening 138*a* is formed in the active device region 101*a*, while the openings 138*p*1, 138*p*2 are formed in the passive device region 101*p*. The gate electrode 132 is exposed in the opening 138*a*, and portions of the resistor structure 114 are exposed in the openings 138*p*1, 138*p*2. In some embodiments, two openings 138*p*1 are formed in the passive device region 101*p* for conductive contacts 150*p*1 (FIG. 18) functioning as terminals to be formed therein, and one or more openings 138*p*2 are formed in the passive device region 101*p* for conductive contacts 150*p*2 (FIG. 18) functioning as tuning electrodes to be formed therein.

Figure 12:
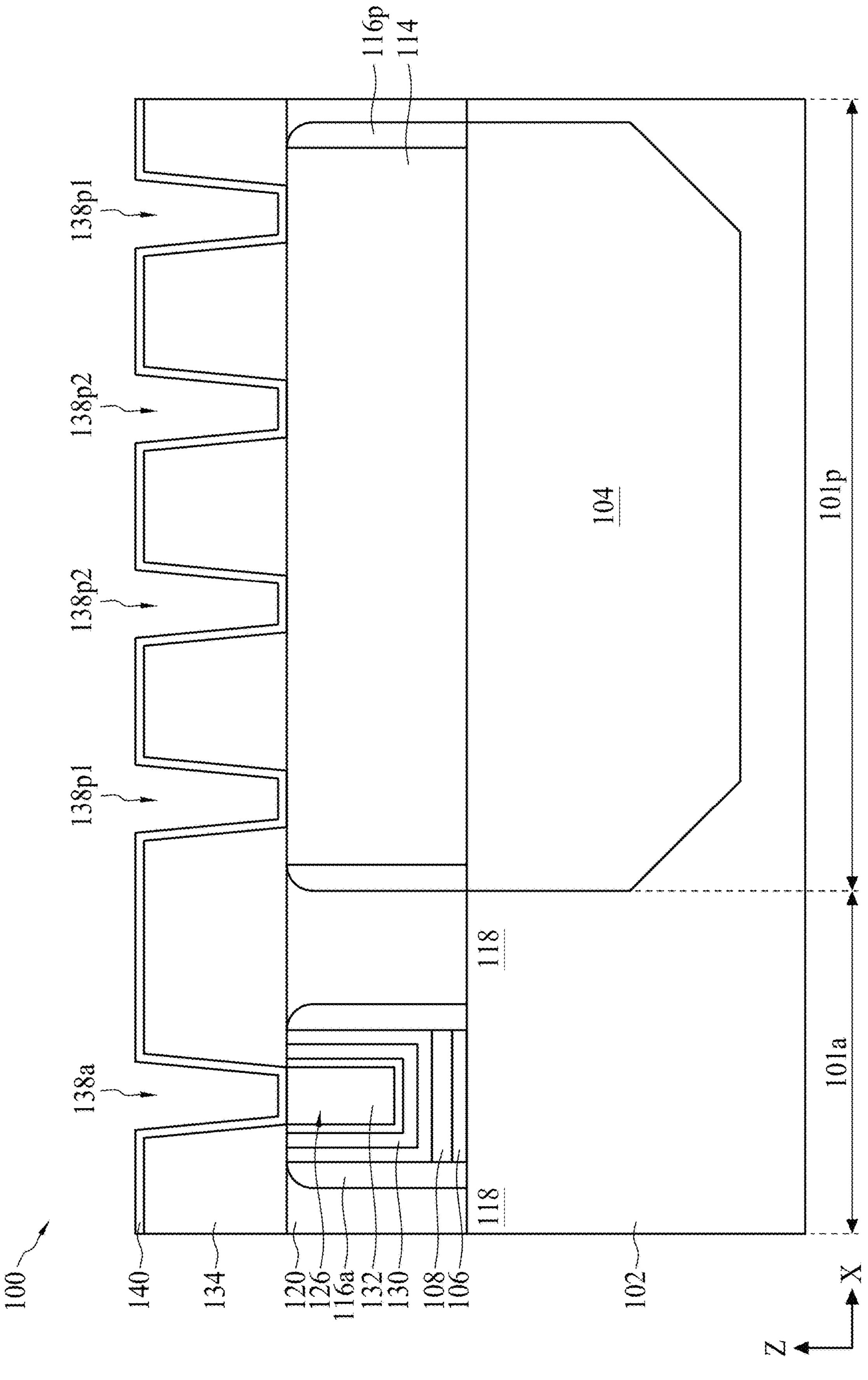

As shown in FIG. 12, a dielectric layer 140 is formed on the second ILD layer 134, in the openings 138*a*, 138*p*1, 138*p*2, and on the gate electrode 132 and portions of the resistor structure 114. The dielectric layer 140 may include any suitable dielectric material, such as an oxide, for example silicon oxide. The dielectric layer 140 may be formed by any suitable process. In some embodiments, the dielectric layer 140 is a conformal layer and is formed by a conformal process, such as ALD.

Figure 13:
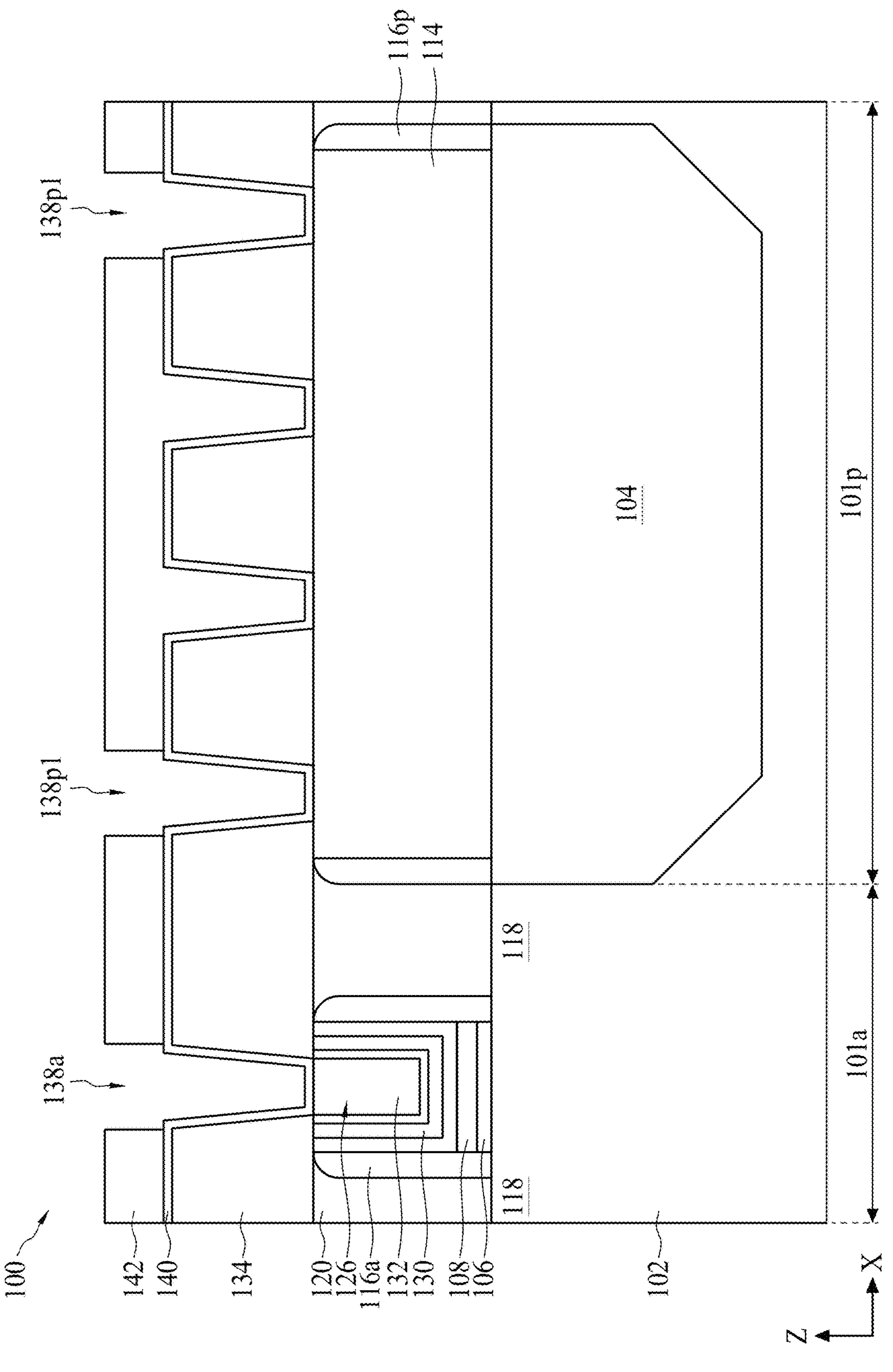
Figure 14:
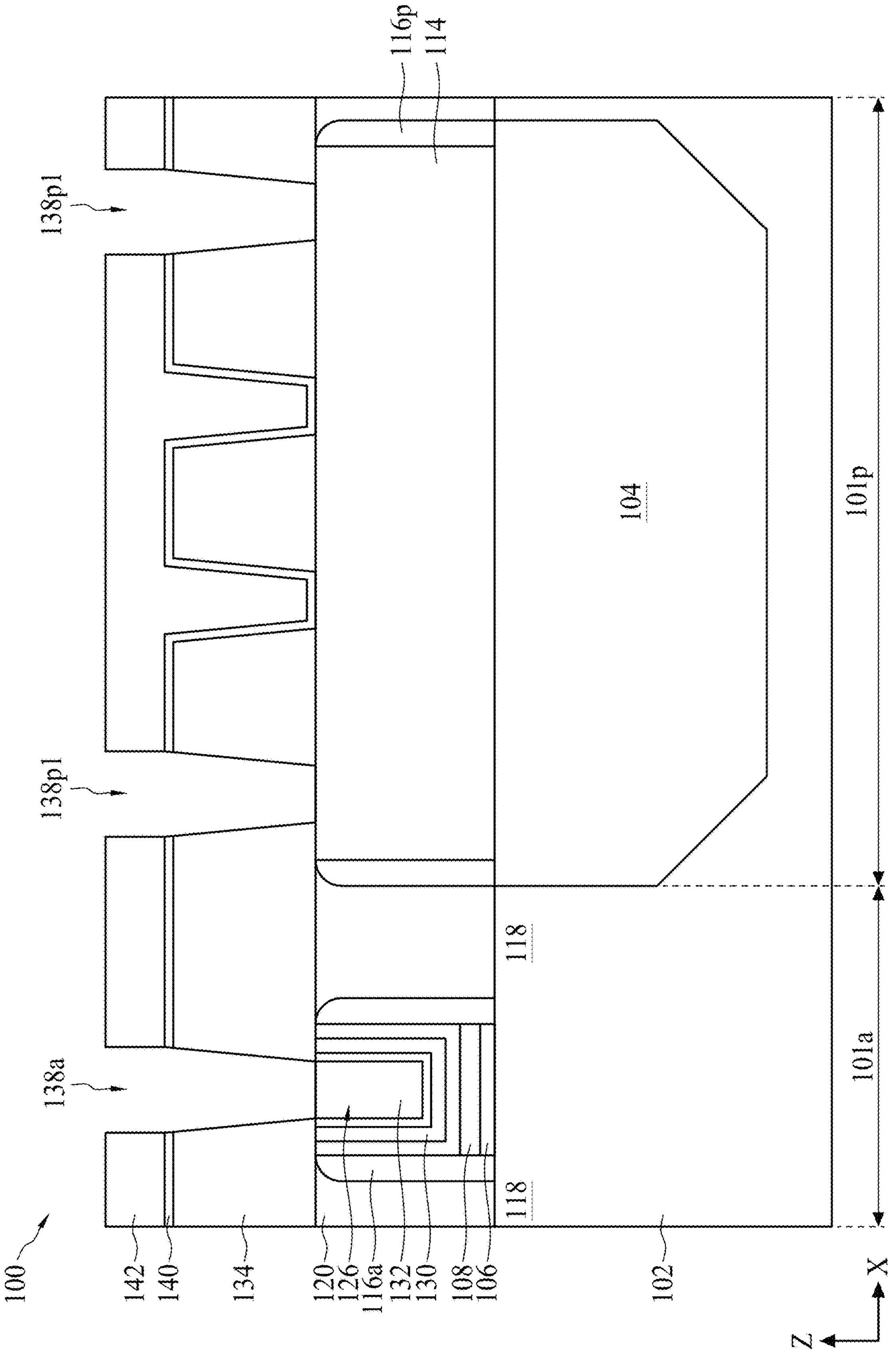
Figure 15:
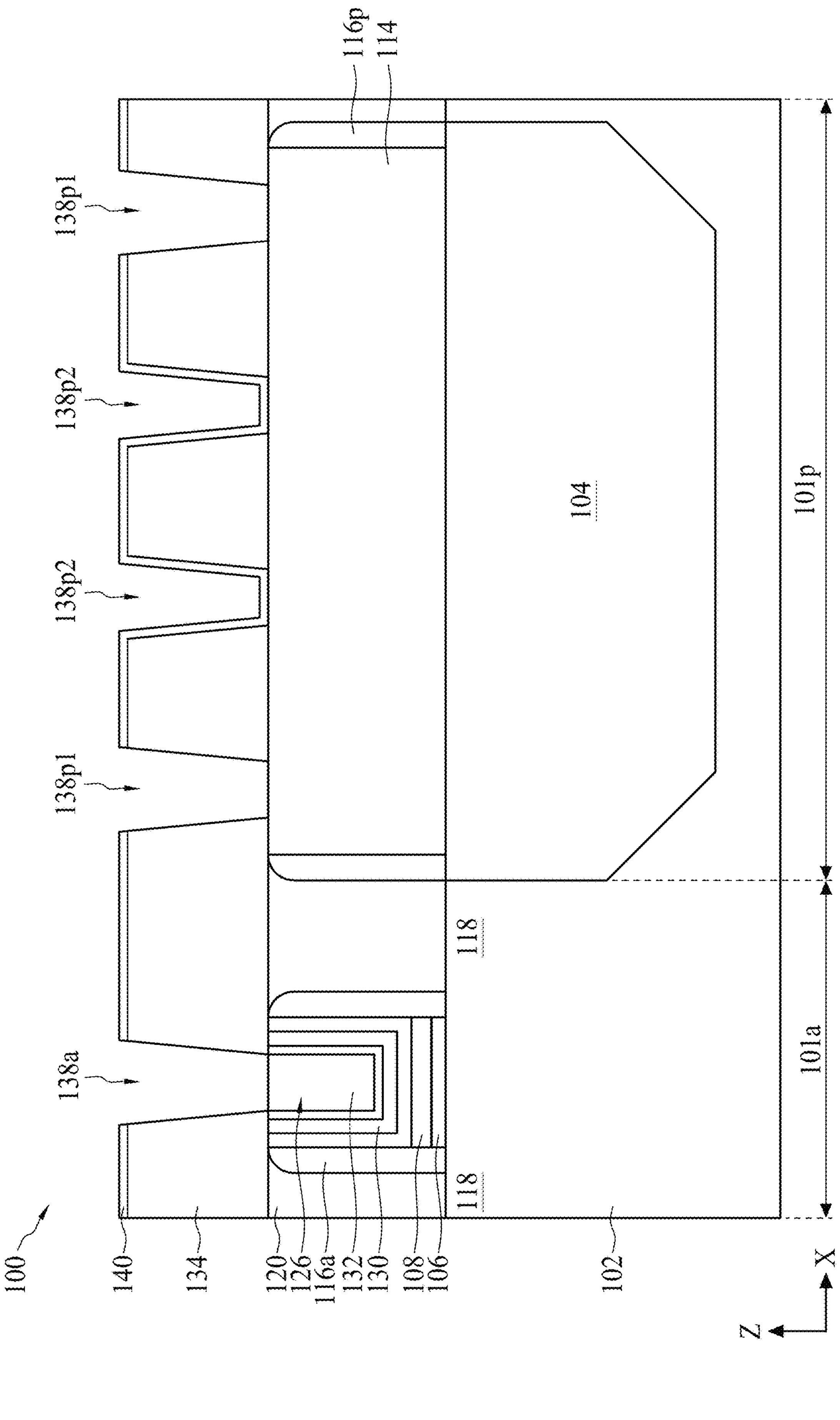

As shown in FIG. 13, a patterned resist layer 142 is formed on the dielectric layer 140. The patterned resist layer 142 fills the openings 138*p*2, while the openings 138*a*, 138*p*1 remain open. As a result, portions of the dielectric layer 140 located in the openings 138*a*, 138*p*1 are exposed. Next, as shown in FIG. 14, the exposed portions of the dielectric layer 140 in the openings 138*a*, 138*p*1 are removed. The exposed portions of the dielectric layer 140 may be removed by a selective etch process that does not substantially affect the second ILD layer 134, the gate electrode 132, and the resistor structure 114. After the removal of the portions of the dielectric layer 140 located in the openings 138*a*, 138*p*1, the patterned resist layer 142 is removed, as shown in FIG. 15. As a result, the dielectric layer 140 remains in the openings 138*p*2.

Figure 16:
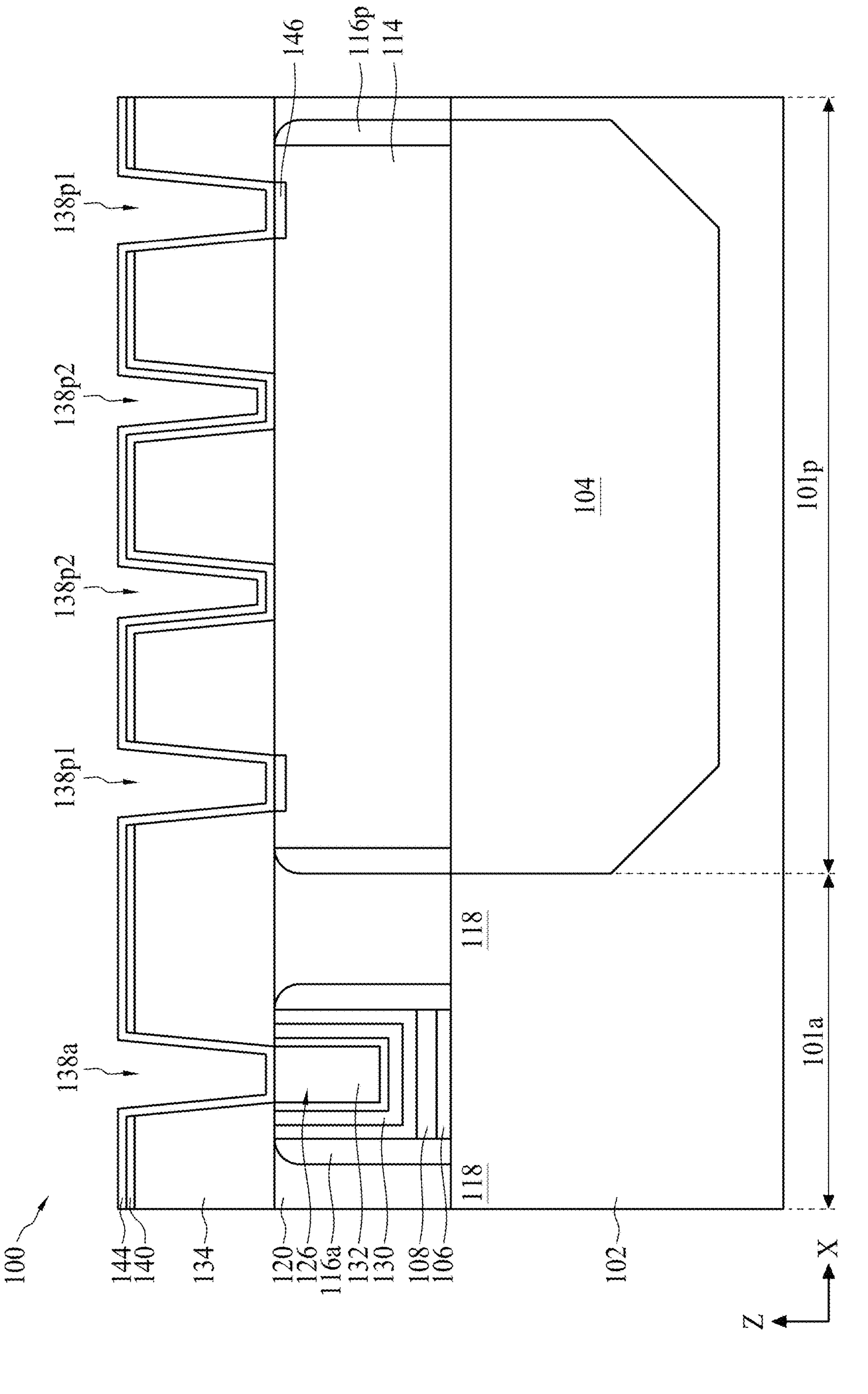

As shown in FIG. 16, a seed layer 144 is formed in the openings 138*a*, 138*p*1, 138*p*2, and on the dielectric layer 140 over the second ILD layer 134. The seed layer 144 may be a metal, such as cobalt, tungsten, copper, ruthenium, aluminum, gold, silver, alloys thereof, the like, or a combination thereof. The seed layer 144 may be deposited by CVD, ALD, PVD, or another deposition technique. In some embodiments, the seed layer 144 reacts with the semiconductor material of the resistor structure 114 to form silicide layers 146. In some embodiments, the seed layer 144 is in contact with the gate electrode 132 and is in electrical contact with the resistor structure 114 via the silicide layers 146. The seed layer 144 is separated from one or more portions of the resistor structure 114 by the dielectric layer 140 in openings 138*p*2, as shown in FIG. 16.

Figure 17:
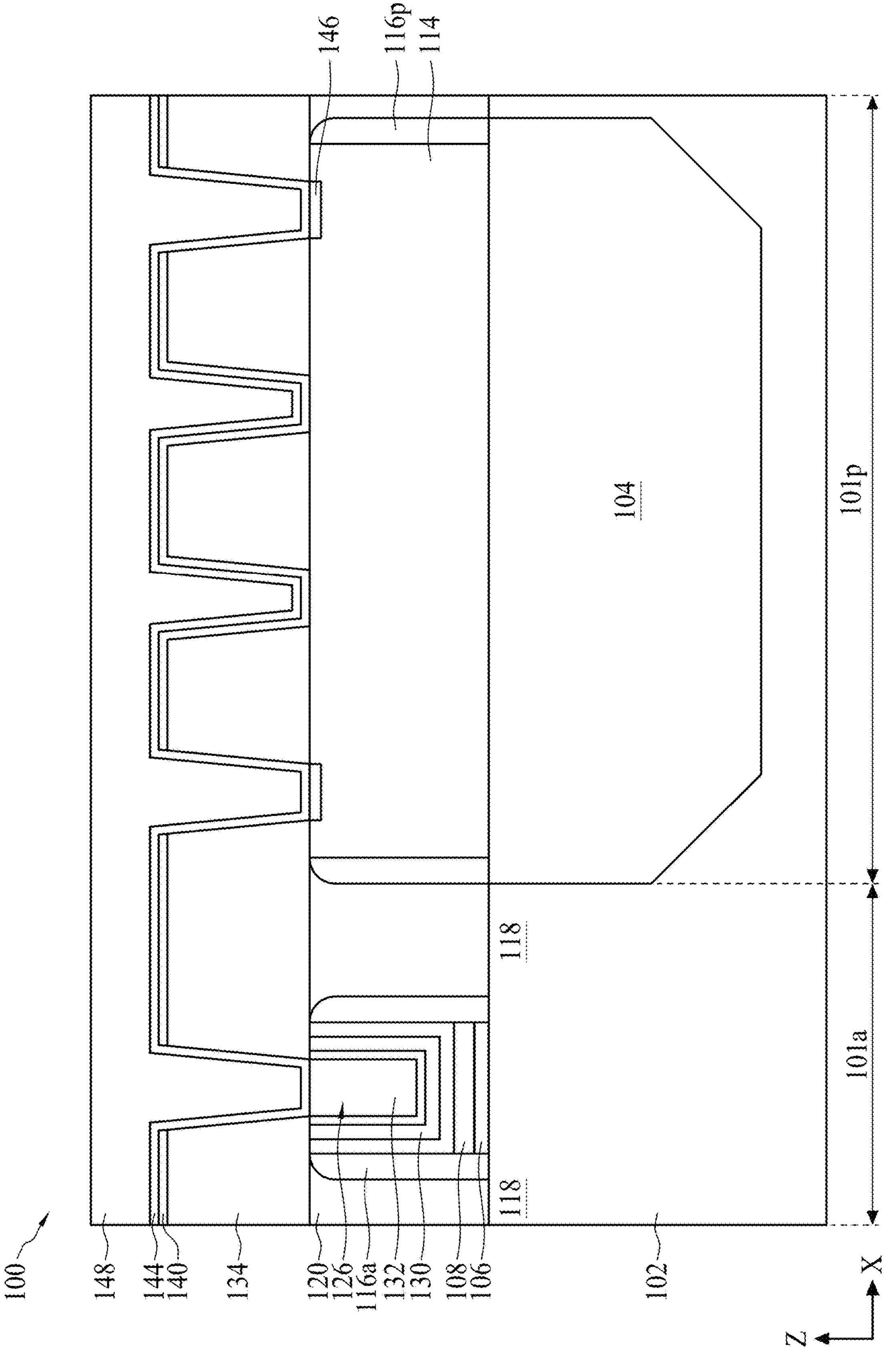

As shown in FIG. 17, a conductive material 148 is formed on the seed layer 144. The conductive material 148 may include an electrically conductive material, such as cobalt, tungsten, copper, ruthenium, aluminum, gold, silver, alloys thereof, the like, or a combination thereof. In some embodiments, the conductive material 148 include the same material as the seed layer 144. The conductive material 148 fills the openings 138*a*, 138*p*1, 138*p*2. In some embodiments, the seed layer 144 is not formed, and the conductive material 148 is directly deposited in the openings 138*a*, 138*p*1, 138*p*2. For example, the conductive material 148 may be in direct contact with the second ILD layer 134 and the gate electrode 132 in the opening 138*a*. The conductive material 148 may be in direct contact with the second ILD layer 134 and the silicide layers 146 in openings 138*p*1. The conductive material 148 may be in direct contact with the dielectric layer 140 in openings 138*p*2.

Figure 18:
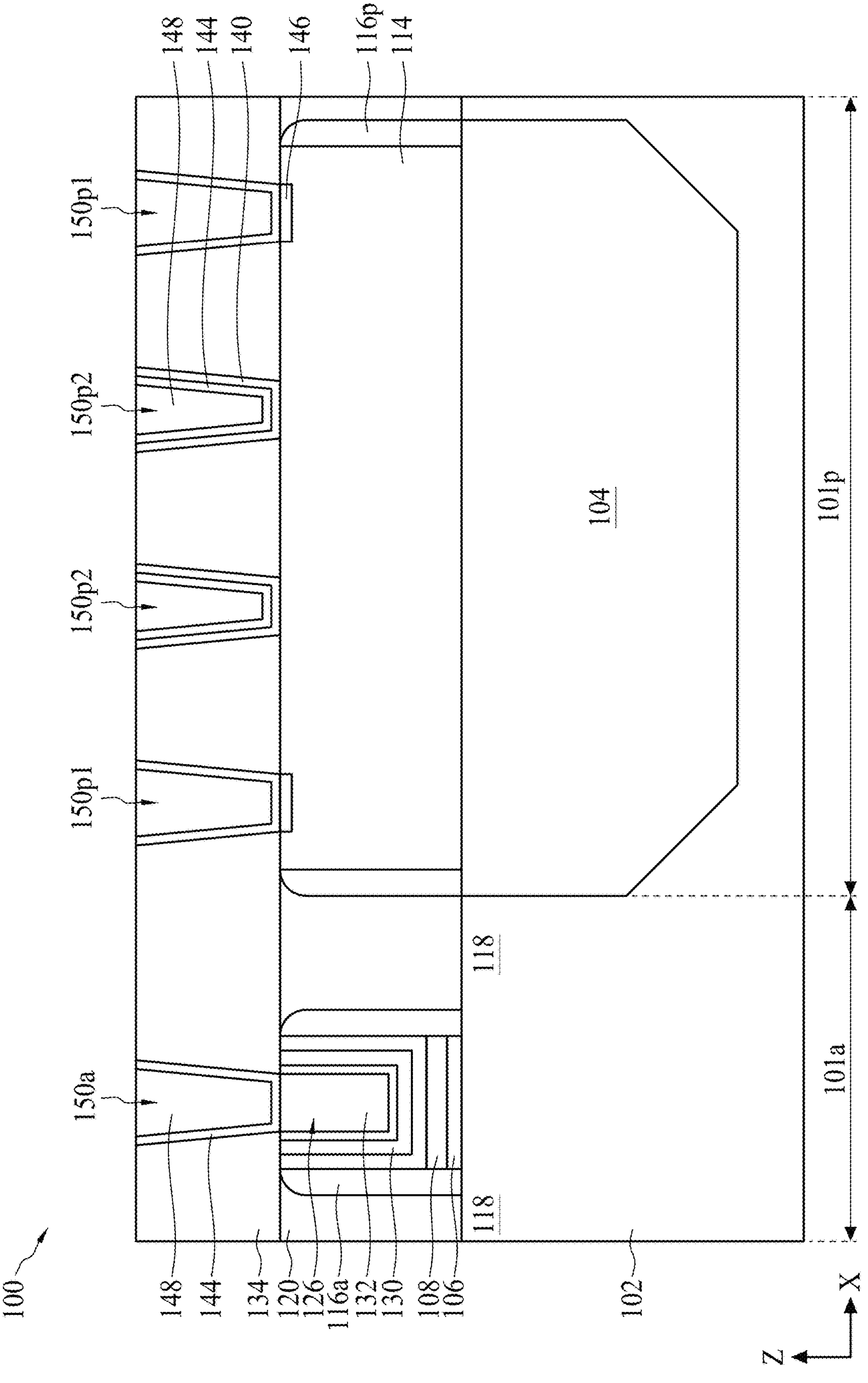

As shown in FIG. 18, portions of the conductive material 148, seed layer 144, and dielectric layer 140 located over the second ILD layer 134 are removed. In some embodiments, a planarization process, such as a CMP process, is performed to remove the portions of the conductive material 148, seed layer 144, and dielectric layer 140. The conductive material 148 and the seed layer 144 located in the active device region 101*a* may be a conductive contact 150*a* for the gate electrode 132. The conductive material 148 and the seed layer 144 located over the silicide layers 146 in the passive device region 101*p* may be conductive contacts 150*p*1 for the resistor structure 114. The conductive material 148 and the seed layer 144 (i.e., the conductive contact 150*p*2) located over the dielectric layer 140 may be tuning electrodes for the resistor structure 114. The tuning electrodes are electrically insulated from the resistor structure 114 by the dielectric layer 140. The tuning electrodes may be used to supply a bias voltage that can change the resistance of the resistor structure 114. In some embodiments, the resistance of the resistor structure 114 can be tuned by the tuning electrodes in a range from about 200 ohms to about 1000 ohms.

Figure 19:
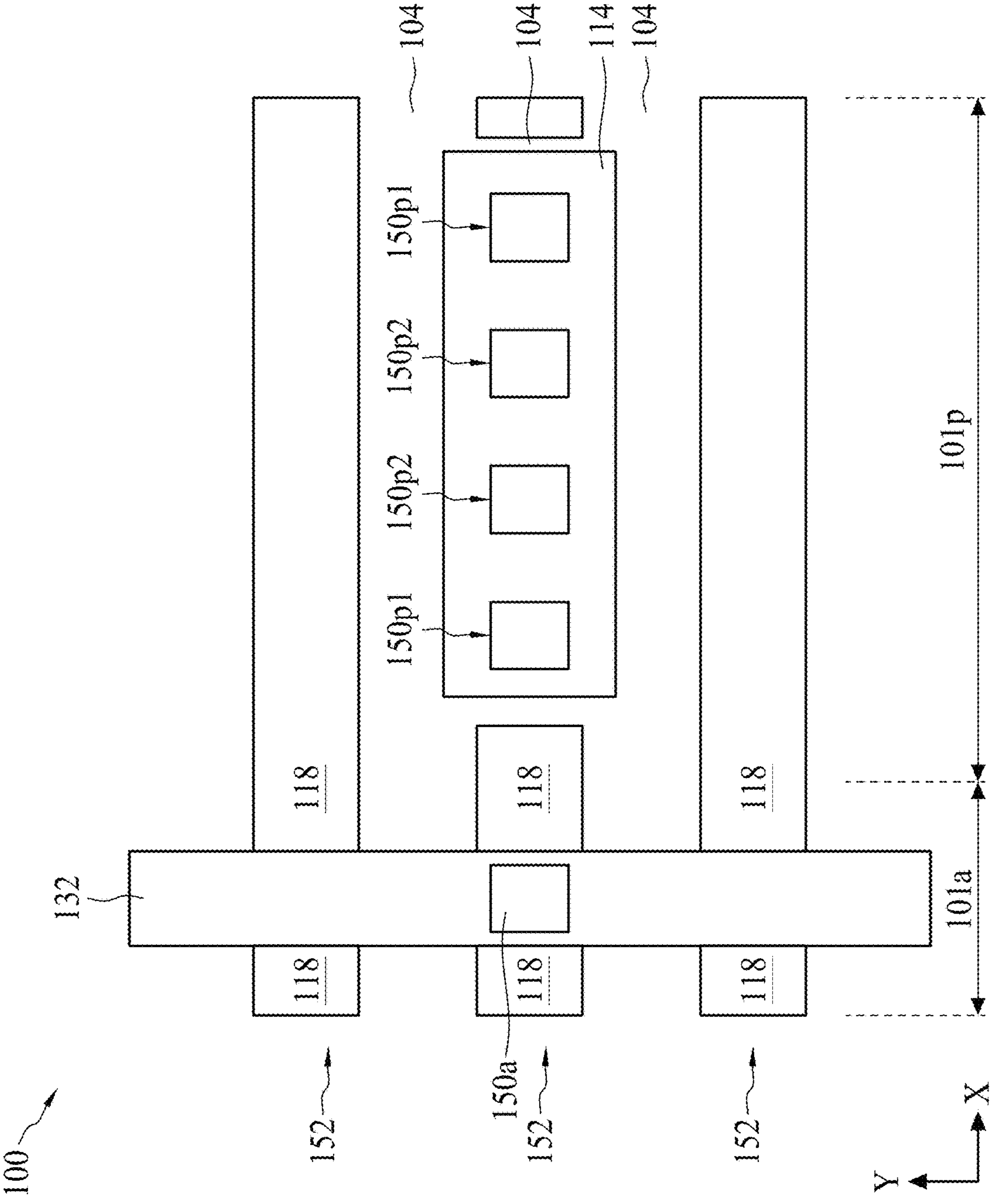
FIGS. 19-21 are top views of the semiconductor device structure, in accordance with some embodiments.
Figure 20:
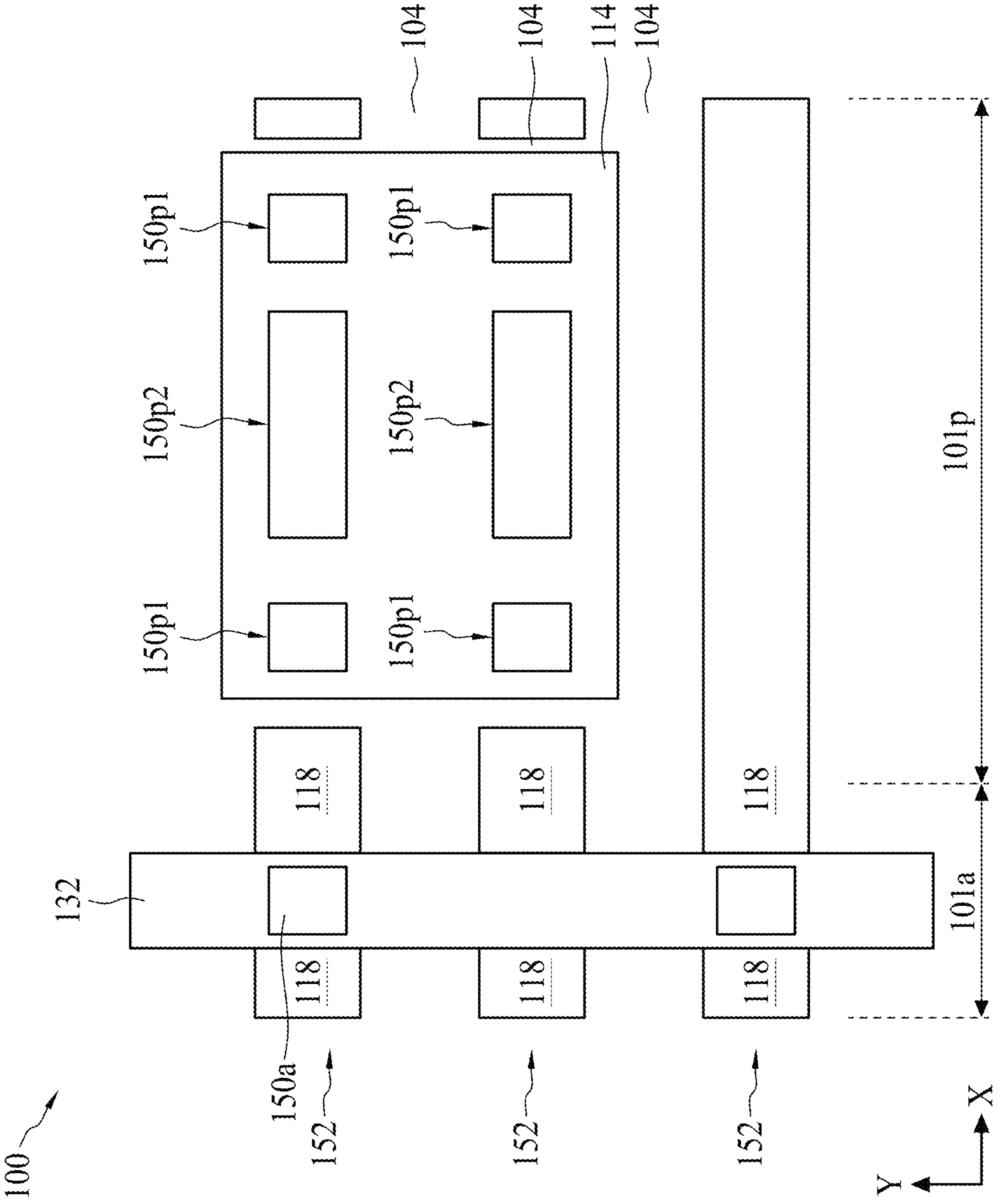
Figure 21:
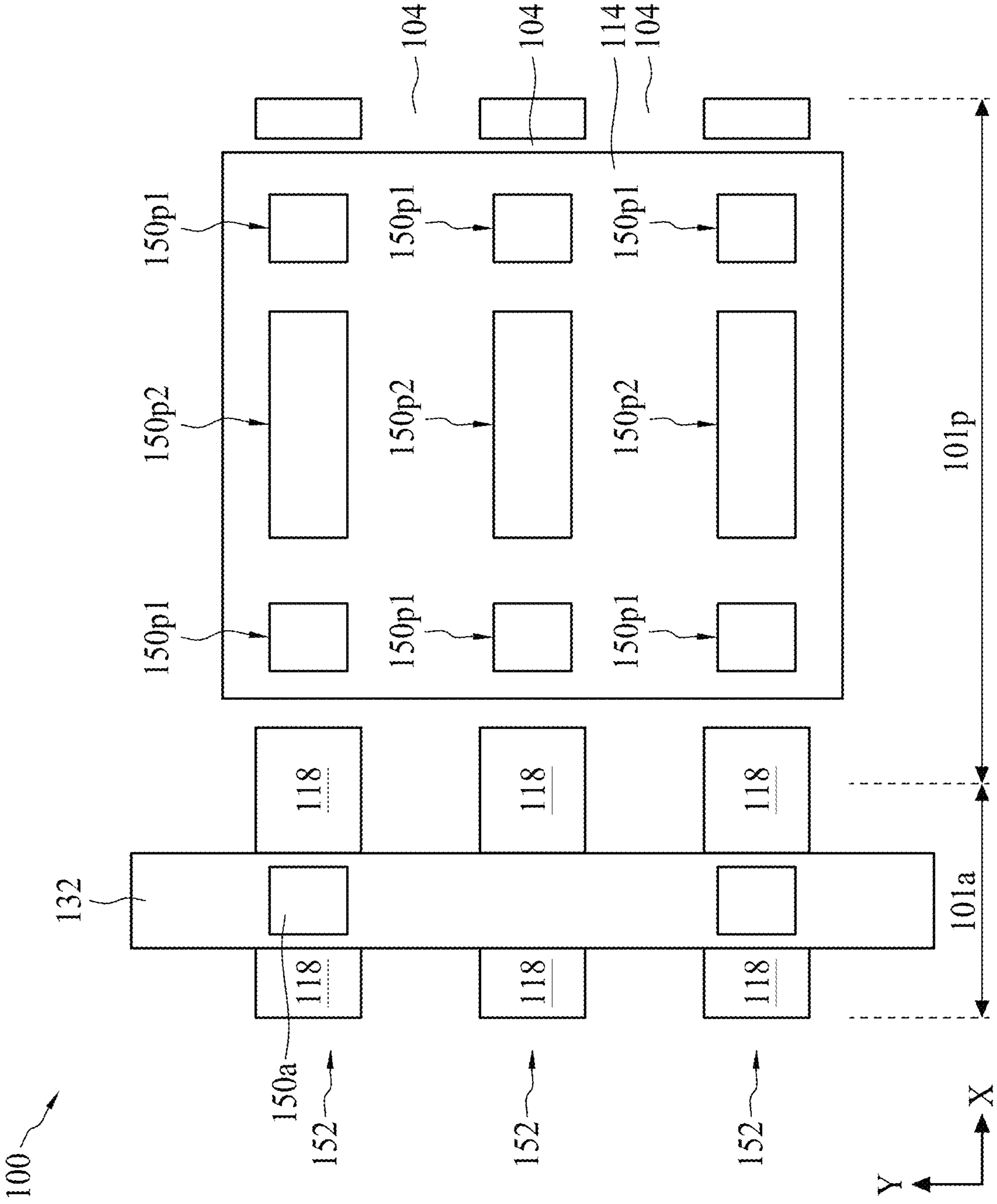

FIGS. 19-21 are top views of the semiconductor device structure 100, in accordance with some embodiments. Some components, such as the second ILD layer 134, the seed layer 144, the one or more work function layers 128, 130, the dielectric layer 140, and the spacers 116*a*, 116*p* are omitted in FIGS. 19 to 21 for clarity. As shown in FIG. 19, the gate electrode 132 extends across one or more active regions 152. In some embodiments, each active region 152 includes an active device, such as a FET including a source region 118, a drain region 118, a gate structure 126 (FIG. 18), and a channel region located under the gate structure 126 and between the source region 118 and the drain region 118. The active regions 152 are separated by the insulating material 104 along the Y direction. The resistor structure 114 may be disposed over the insulating material 104 adjacent one active region 152, as shown in FIG. 19. The conductive contacts 150*p*1 are disposed over the resistor structure 114 for providing a current to flow through the resistor structure 114. In some embodiments, the conductive contacts 150*p*1 are conductive vias. The conductive contacts 150*p*2 are disposed over the resistor structure 114 to function as bias electrodes that can tune the resistance of the resistor structure 114. In some embodiments, the conductive contacts 150*p*2 are conductive vias, as shown in FIG. 19.

FIG. 20 is a top view of the semiconductor device structure 100, in accordance with alternative embodiments. As shown in FIG. 20, the resistor structure 114 is disposed over the insulating material 104 adjacent two active regions 152 along the Y direction. Multiple conductive contacts 150*p*1 may be formed over the resistor structure 114. In some embodiments, the conductive contacts 150*p*2 are conductive lines.

FIG. 21 is a top view of the semiconductor device structure 100, in accordance with alternative embodiments. As shown in FIG. 21, the resistor structure 114 is disposed over the insulating material 104 adjacent three active regions 152 along the Y direction. Multiple conductive contacts 150*p*1 may be formed over the resistor structure 114, and multiple conductive contacts 150*p*2 (conductive lines) may be formed over the resistor structure 114.

Figure 22:
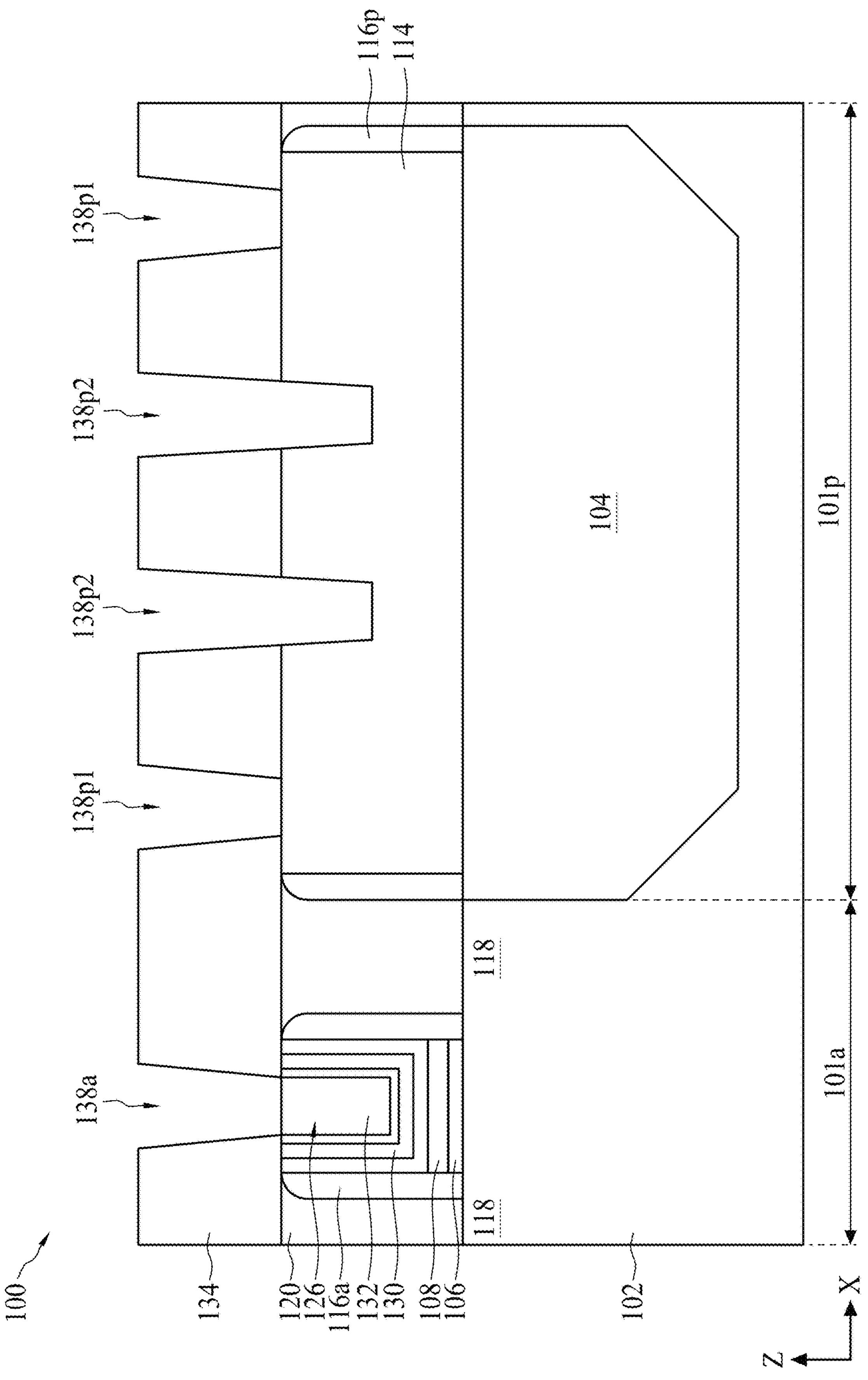
FIGS. 22-25 illustrate cross-sectional side views of various stages of manufacturing the semiconductor device structure, in accordance with alternative embodiments.
Figure 23:
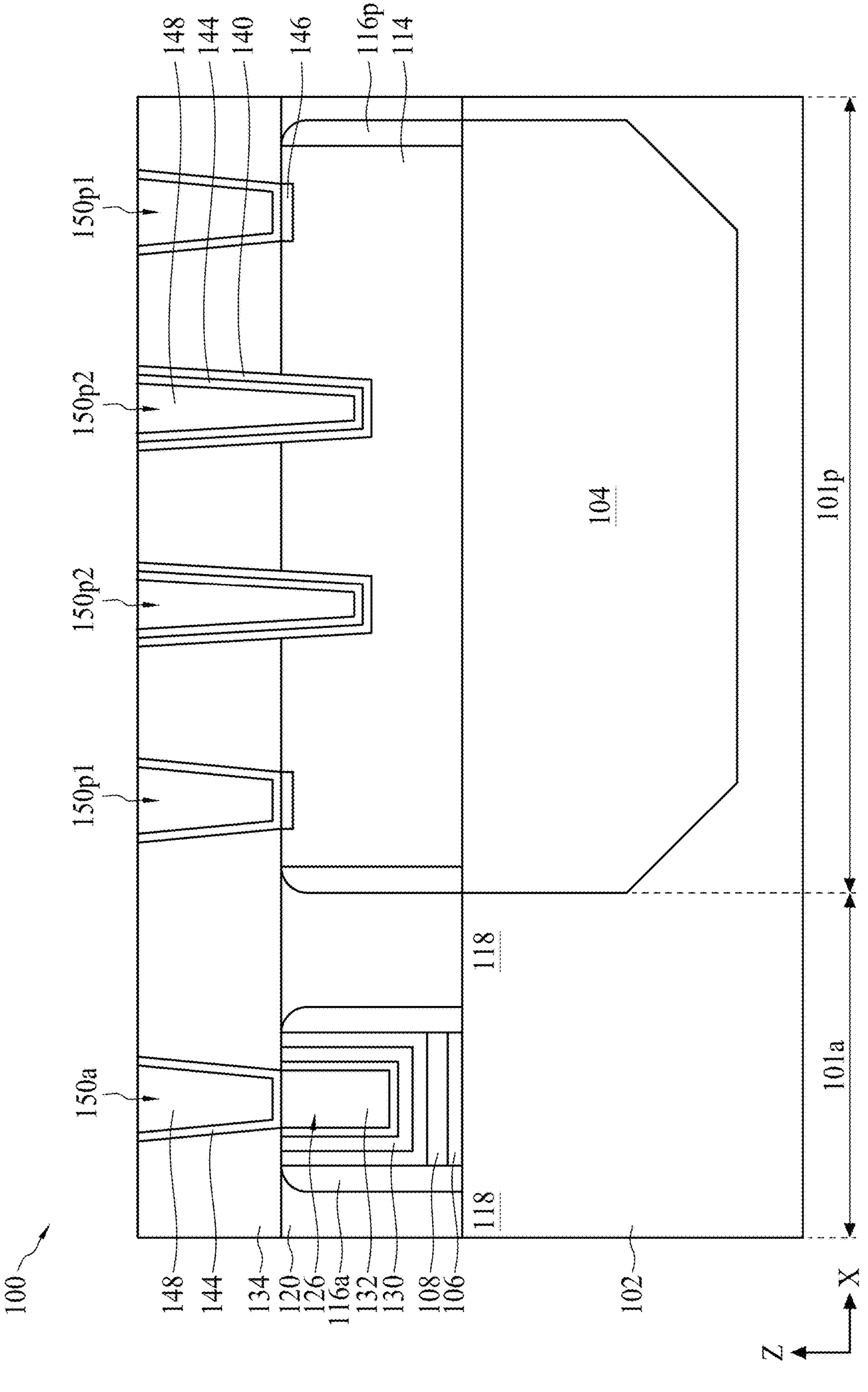

FIGS. 22-25 illustrate cross-sectional side views of various stages of manufacturing the semiconductor device structure 100, in accordance with alternative embodiments. As shown in FIG. 22, in some embodiments, the openings 138*p*2 extend into the resistor structure 114. An additional mask may be used to form the deeper openings 138*p*2. For example, after the formation of the semiconductor device structure 100 shown in FIG. 11, the additional mask may be formed to cover the openings 138*a*, 138*p*1, while openings 138*p*2 are exposed. An etch process, such as a dry etch process, a wet etch process, or a combination thereof, may be performed to extend the openings 138*p*2 into the resistor structure 114. The additional mask is then removed, and the resulting structure is shown in FIG. 22. Next, the processes described in FIGS. 12 to 18 are performed to form the dielectric layer 140 and the conductive contacts 150*a*, 150*p*1, 150*p*2, as shown in FIG. 23. The dielectric layer 140 and the seed layer 144, the conductive material 148 of the conductive contact 150*p*2 may extend into the resistor structure 114. In some embodiments, the dielectric layer 140 and the conductive contacts 150*p*2 extend into about half of the thickness along the Z direction of the resistor structure 114. With the conductive contacts 150*p*2 extending into the resistor structure 114, the tuning range of the resistance of the resistor structure 114 is broadened. For example, with the conductive contacts 150*p*2 disposed over the resistor structure 114 as shown in FIG. 18, the resistance of the resistor structure 114 can be tuned in a range from about 550 ohms to about 650 ohms by the conductive contacts 150*p*2. With the conductive contacts 150*p*2 extending into the resistor structure 114 as shown in FIG. 23, the resistance of the resistor structure 114 can be tuned in a range from about 400 ohms to about 800 ohms by the conductive contacts 150*p*2.

Figure 24:
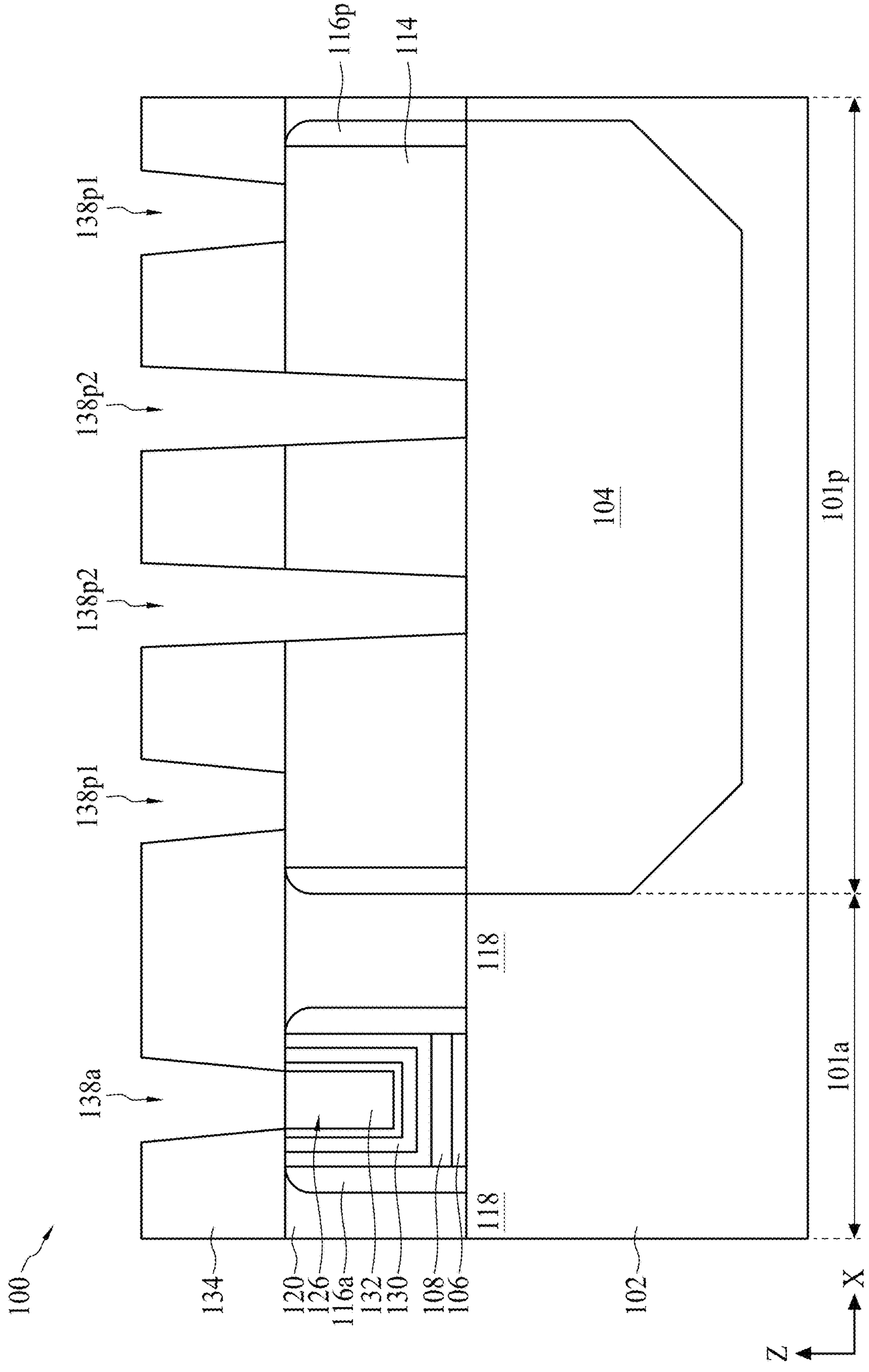
Figure 25:
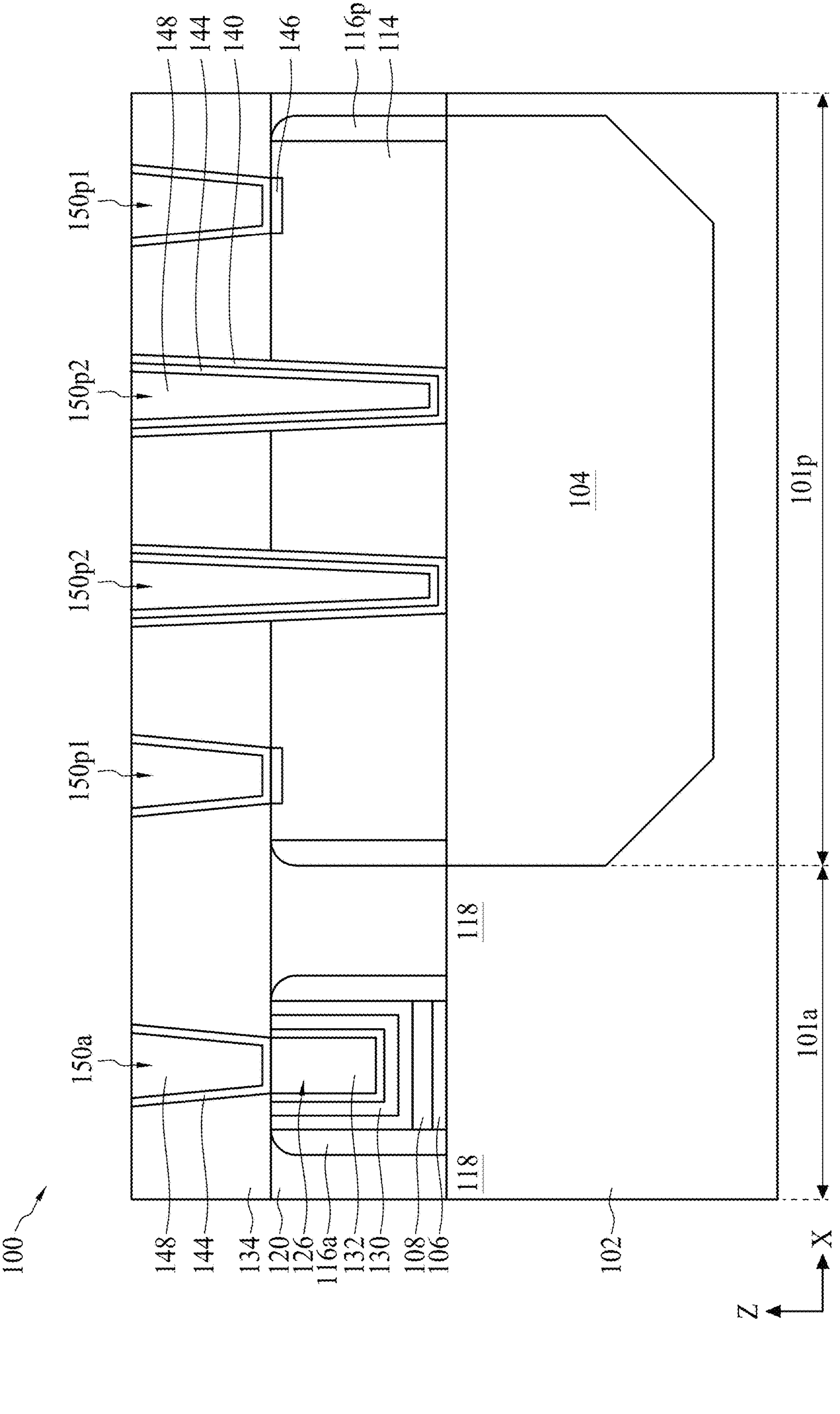

In some embodiments, the openings 138*p*2 extends through the resistor structure 114, as shown in FIG. 24. The insulating material 104 may be exposed in the openings 138*p*2. The additional mask described in FIG. 22 may be used, and the etch process described in FIG. 22 may be performed for a longer period of time that etches through the resistor structure 114 until the insulating material 104 is exposed. Next, the processes described in FIGS. 12 to 18 are performed to form the dielectric layer 140 and the conductive contacts 150*a*, 150*p*1, 150*p*2, as shown in FIG. 25. The dielectric layer 140 and the seed layer 144, the conductive material 148 of the conductive contact 150*p*2 may extend through the resistor structure 114, and the dielectric layer 140 may be in contact with the insulating material 104. With the conductive contacts 150*p*2 extending through the resistor structure 114, the tuning range of the resistance of the resistor structure 114 is further broadened. For example, with the conductive contacts 150*p*2 extending through the resistor structure 114 as shown in FIG. 25, the resistance of the resistor structure 114 can be tuned in a range from about 200 ohms to about 1000 ohms by the conductive contacts 150*p*2.

Figure 26:
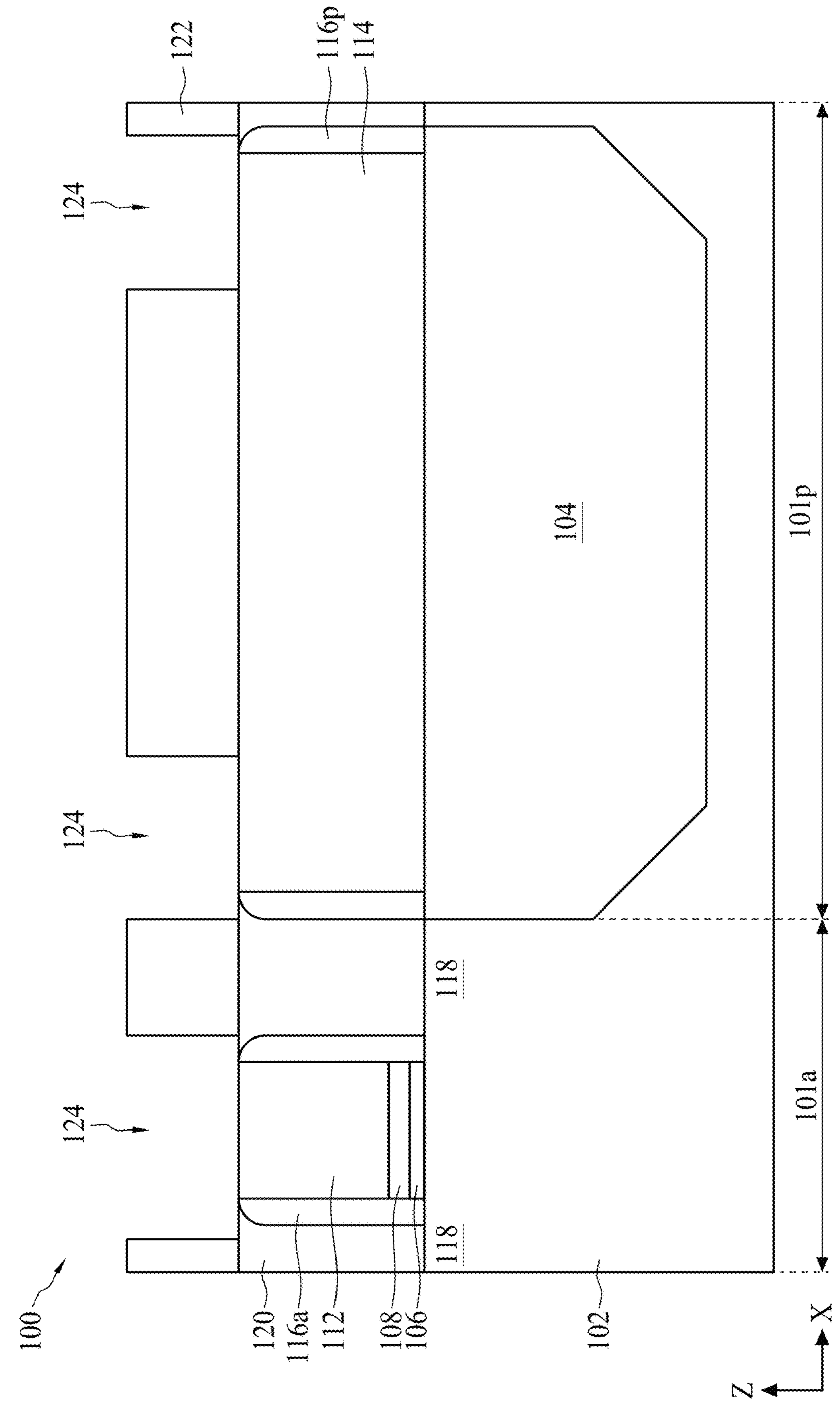
FIGS. 26-28 illustrate cross-sectional side views of various stages of manufacturing the semiconductor device structure, in accordance with alternative embodiments.
Figure 27:
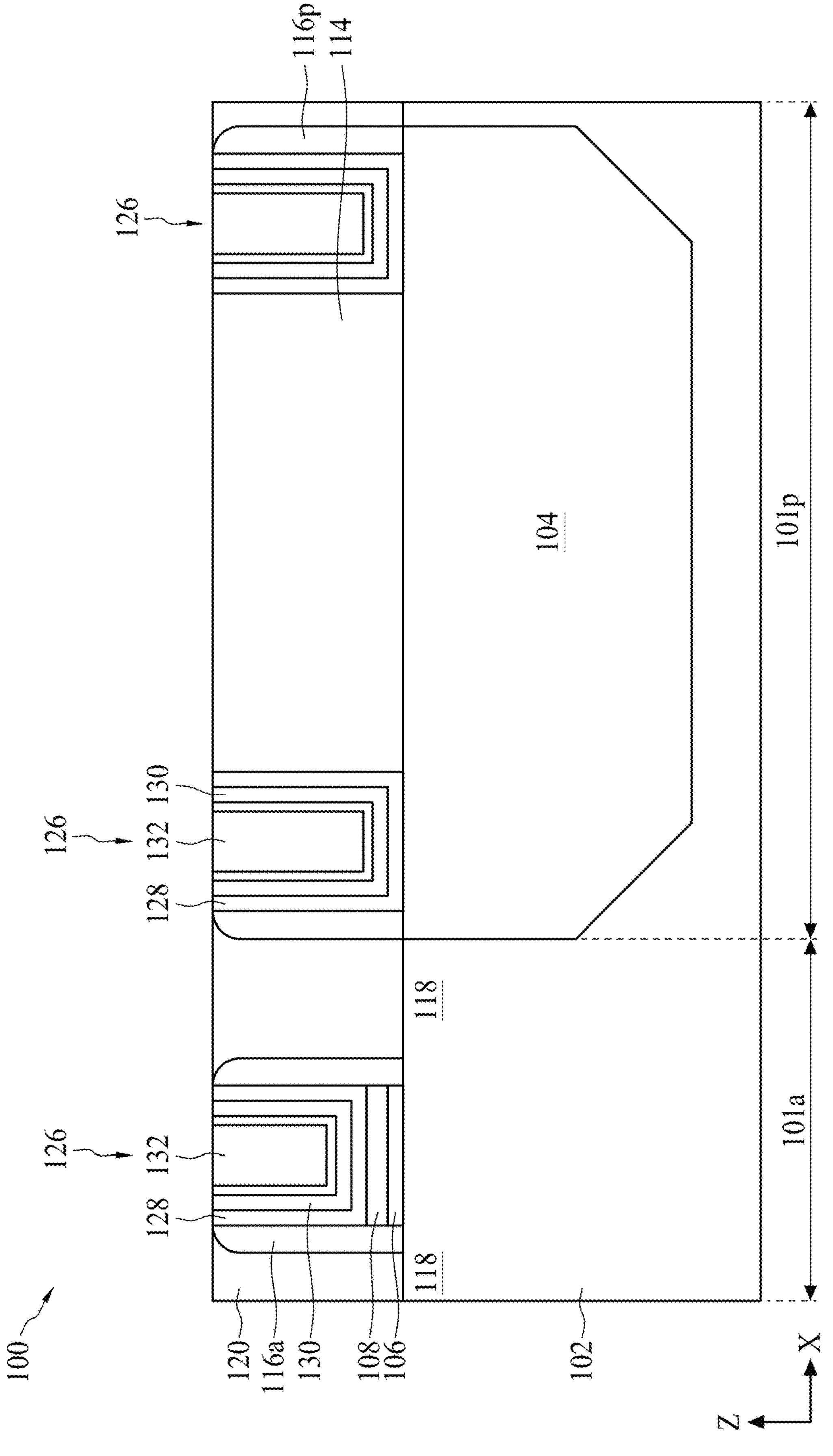
Figure 28:
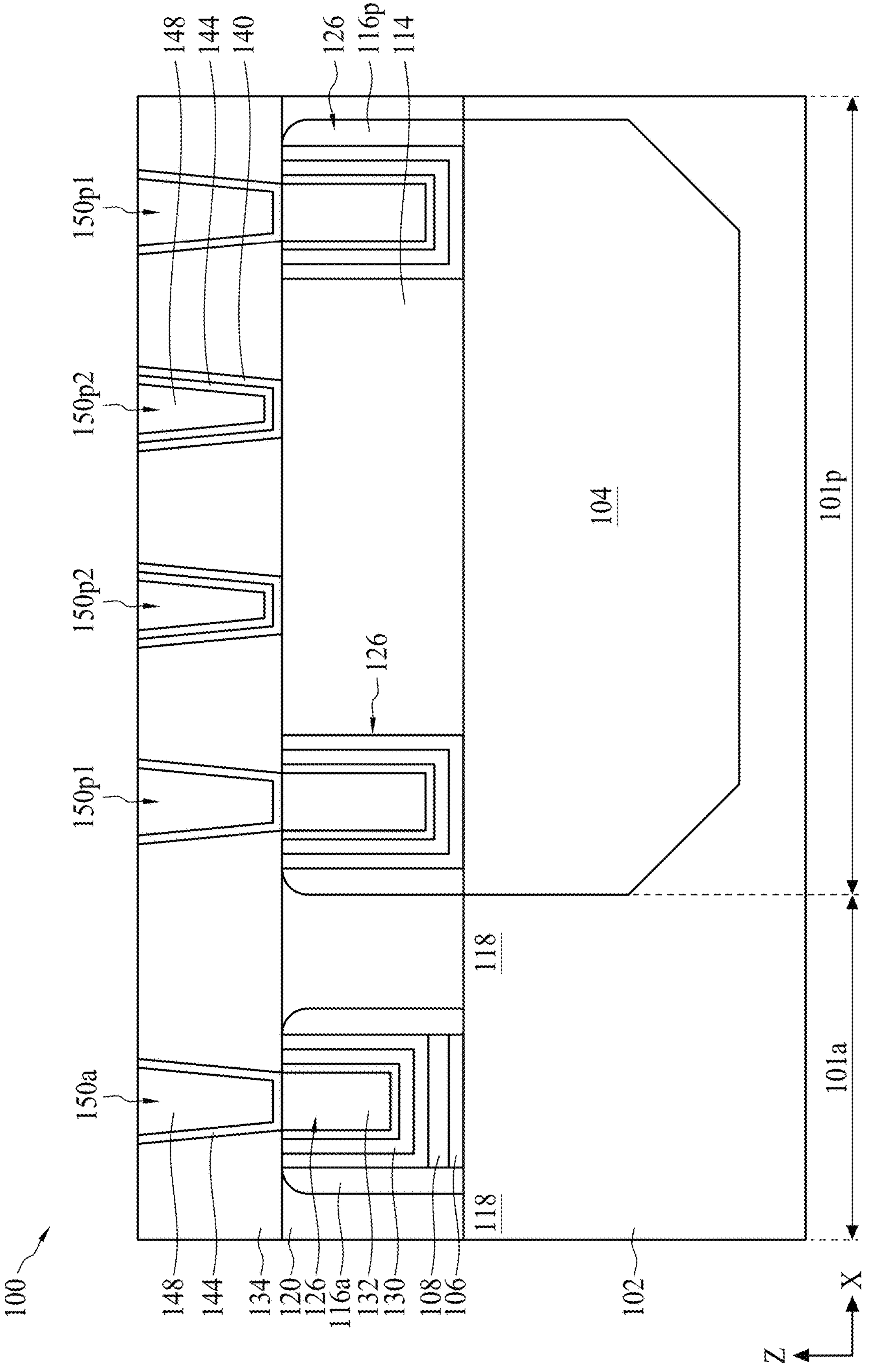

FIGS. 26-28 illustrate cross-sectional side views of various stages of manufacturing the semiconductor device structure 100, in accordance with alternative embodiments. In some embodiments, the resistor structure 114 is larger, such as the resistor structure 114 shown in FIG. 21. As a result, dishing defects may occur after a CMP process, such as the CMP process described in FIGS. 7 and 9. In some embodiments, in order to reduce dishing defects, the gate structure 126 may be formed in the passive device region 101*p*. As shown in FIG. 26, the patterned mask layer 122 includes the openings 124 in both active device region 101*a* and passive device region 101*p*. In some embodiments, the openings 124 in the passive device region 101*p* expose edge portions of the resistor structure 114, as shown in FIG. 26.

As shown in FIG. 27, the sacrificial gate electrode 112 located in the active device region 101*a* and the exposed portions of the resistor structure 114 located in the passive device region 101*p* are removed and replaced with the gate structures 126. As shown in FIG. 27, the work function layers 128 are deposited on the insulating material 104 in the passive device region 101*p*, while the work function layer 128 is deposited on the metal-containing layer 108 in the active device region 101*a*. The gate structures 126 formed in the passive device region 101*p* are not active gate structures and do not function as gates. Instead, the gate structures 126 formed in the passive device region 101*p* function as conductive features to provide a current to flow through the resistor structure 114, because the materials of the work function layers 128, 130 and the gate electrode 132 are electrically conductive. The gate structures 126 formed in the passive device region 101*p* also help to reduce dishing defects after a CMP process. For example, portions of the work function layers 128, 130 and gate electrodes 132 may be formed on the ILD layer 120 and the resistor structure 114. A CMP process may be performed to remove the portions of the work function layers 128, 130 and gate electrodes 132 may be formed on the ILD layer 120 and the resistor structure 114. With the gate structures 126 located in the passive device region 101*p*, dishing defects are reduced.

As shown in FIG. 28, the second ILD layer 134 and the conductive contacts 150*a*, 150*p*1, 150*p*2 are formed over the first ILD layer 120, the gate structures 126, and the resistor structure 114. The conductive contacts 150*p*1 are in contact with the gate electrodes 132 located in the passive device region 101*p*, and the gate structures 126 located in the passive device regions 101*p* provide a path for current to flow through the resistor structure 114. In some embodiments, the conductive contacts 150*p*2 and the dielectric layer 140 are disposed on the resistor structure 114, as shown in FIG. 28. In some embodiments, the conductive contacts 150*p*2 and the dielectric layer 140 extend into the resistor structure 114, as shown in FIG. 23. In some embodiments, the conductive contacts 150*p*2 and the dielectric layer 140 extend through the resistor structure 114, as shown in FIG. 25. With the gate electrode 132 exposed in the openings 138*p*1 (FIG. 11), the additional mask described in FIG. 22 may not be used. By using a selective etch process to remove portions of the resistor structure 114 exposed in the openings 138*p*2 (FIG. 11), the gate electrodes 132 exposed in the openings 138*a*, 138*p*1 (FIG. 11) may not be substantially affected.

Figure 29:
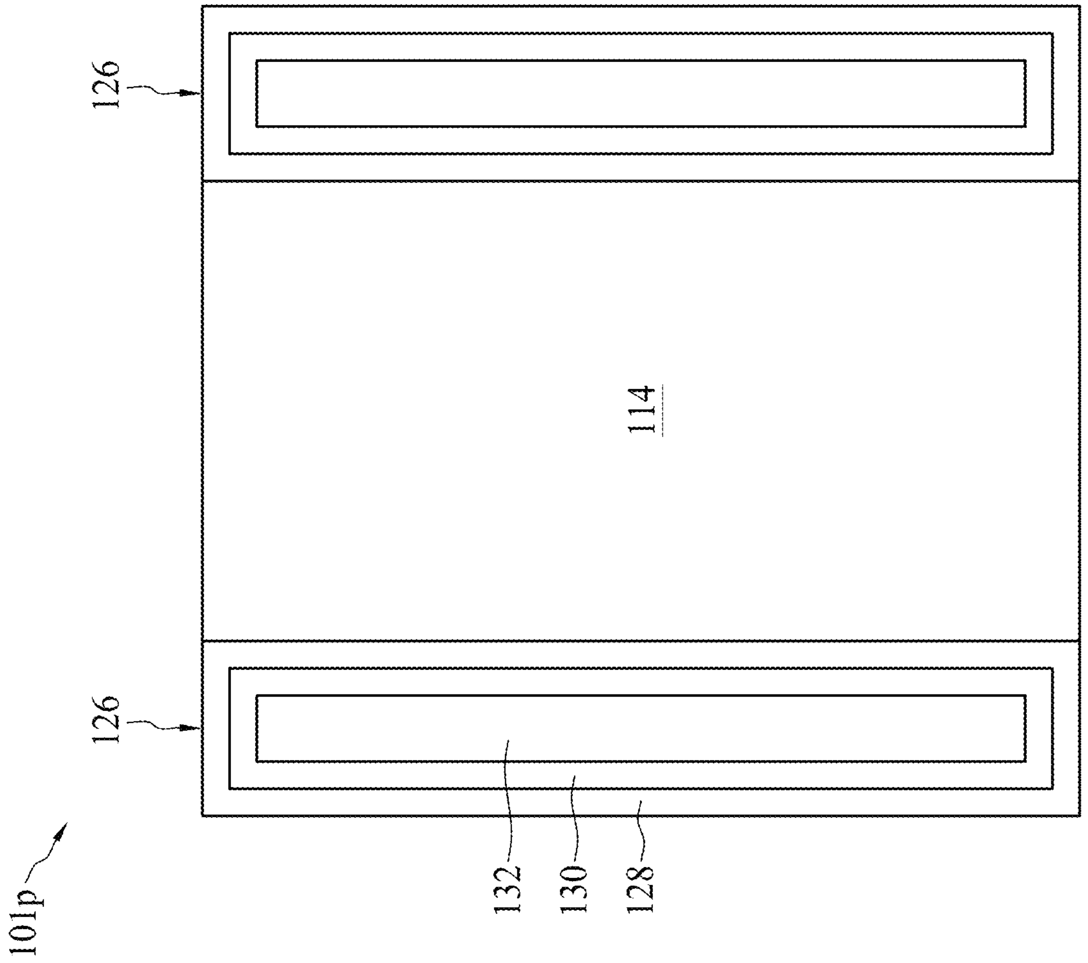
FIG. 29 is a top view of a passive device region of the semiconductor device structure of FIG. 27, in accordance with some embodiments.

FIG. 29 is a top view of the passive device region 101*p* of the semiconductor device structure 100 of FIG. 27, in accordance with some embodiments. As shown in FIG. 29, the resistor structure 114 is disposed between two gate structures 126. In some embodiments, the length of the gate structure 126 in the Y direction may be substantially the same as the length of the resistor structure 114 in the Y direction. In some embodiments, the length of the gate structure 126 in the Y direction may be substantially greater than the length of the resistor structure 114 in the Y direction. For example, the gate structures 126 may extend into another active device region to form a transistor. Thus, in some embodiments, a first portion of the gate structure 126 is disposed over a channel region between a source region and a drain region, while a second portion of the gate structure 126 is disposed adjacent a resistor structure, such as the resistor structure 114. In some embodiments, the length of the gate structure 126 in the Y direction may be substantially less than the length of the resistor structure 114 in the Y direction.

Figure 30:
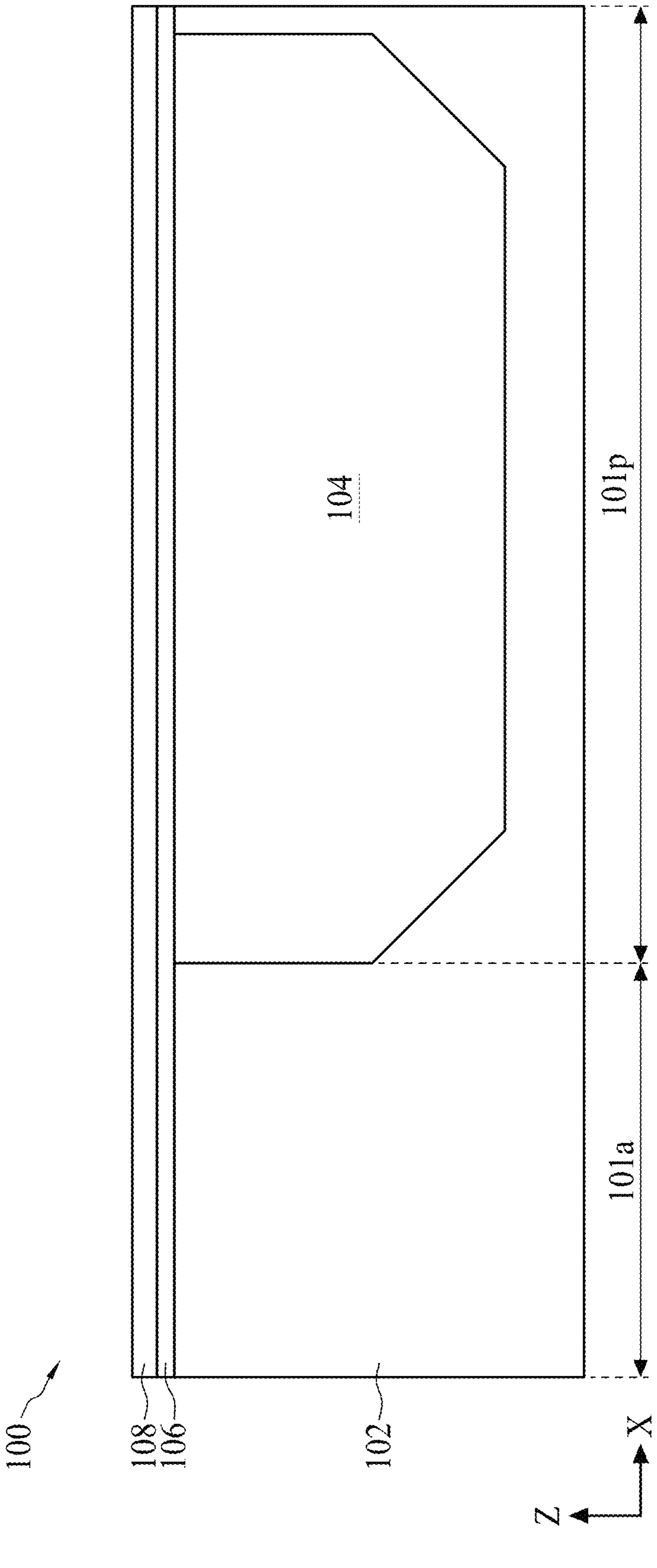
FIGS. 30-39 illustrate cross-sectional side views of various stages of manufacturing the semiconductor device structure, in accordance with alternative embodiments.

In some embodiments, the resistor structure 114 is a resistor device, as shown in FIG. 18. In some embodiments, a resistor structure includes more than one resistor device. FIGS. 30-39 illustrate cross-sectional side views of various stages of manufacturing the semiconductor device structure 100 including a resistor structure having two resistor devices. As shown in FIG. 30, the dielectric layer 106 and the metal-containing layer 108 are deposited over the substrate 102 and the insulating material 104.

Figure 31:
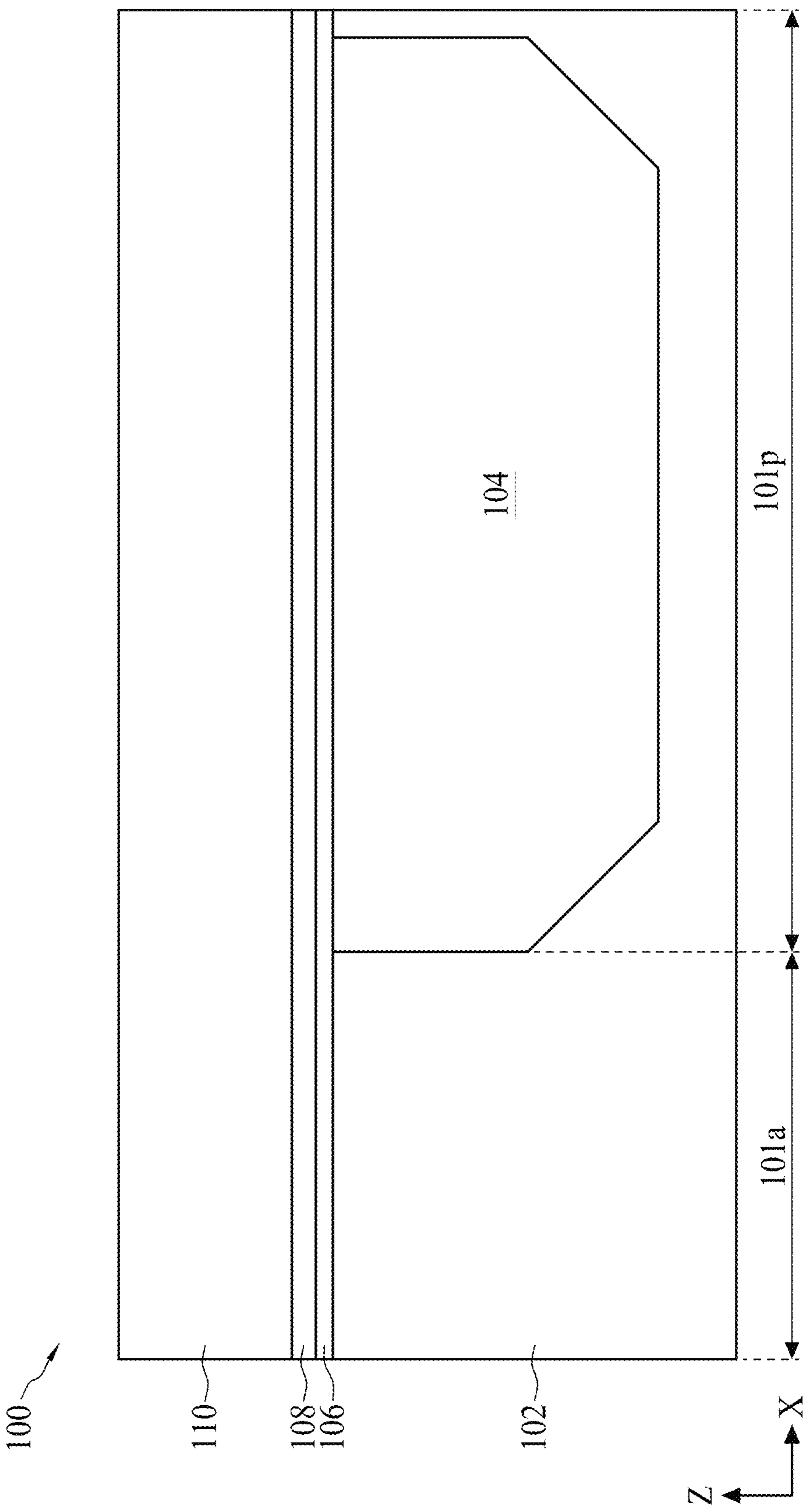
Figure 32:
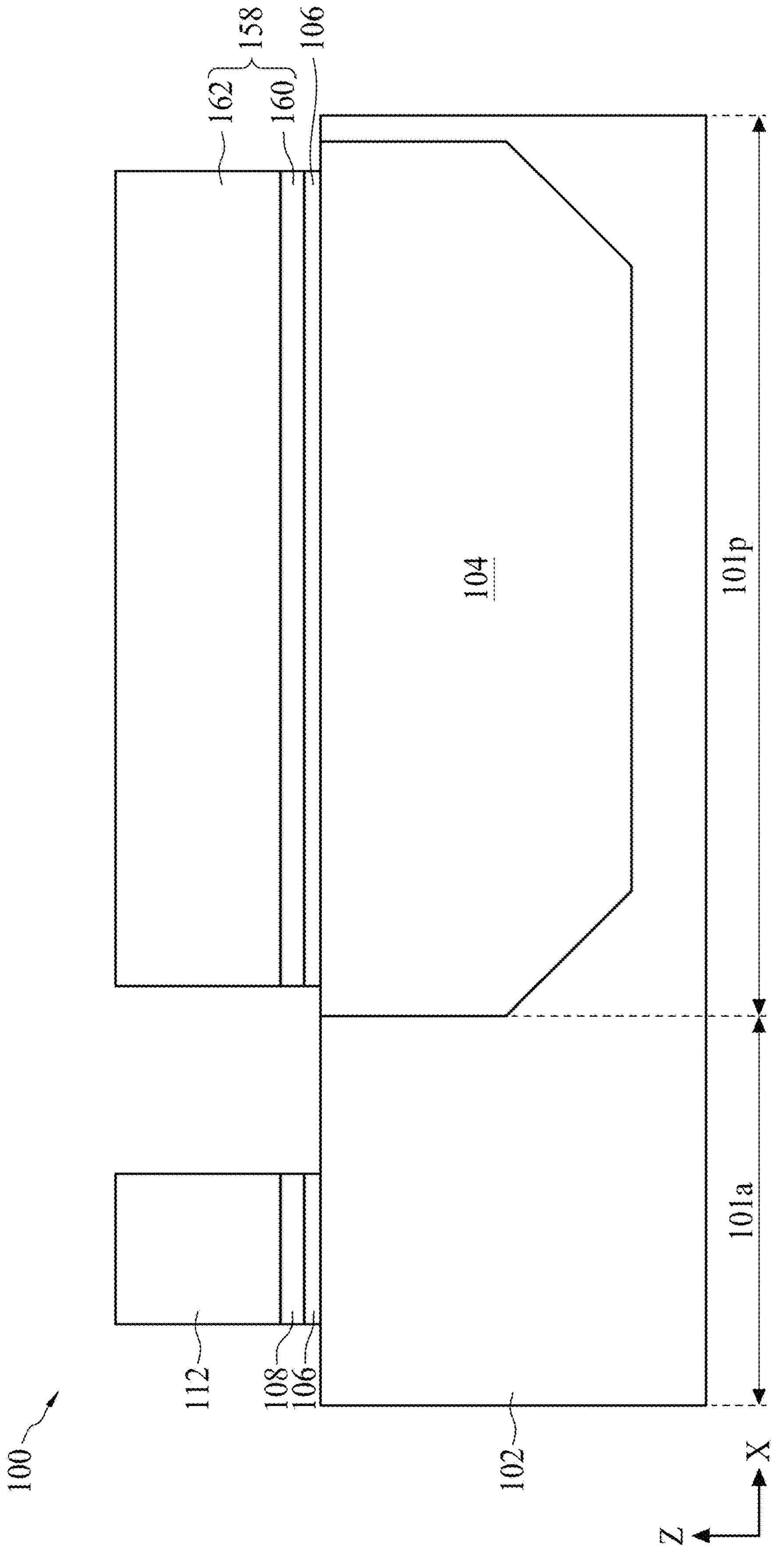

As shown in FIG. 31, the semiconductor material 110 is deposited on the metal-containing layer 108. The metal-containing layer 108 and the dielectric layer 106 are not patterned prior to the deposition of the semiconductor material 110. Next, as shown in FIG. 32, the semiconductor material 110, the metal-containing layer 108, and the dielectric layer 106 are patterned to form the sacrificial gate electrode 112 in the active device region 101*a* and a resistor structure 158 in the passive device region 101*p*. The sacrificial gate electrode 112 is disposed on the metal-containing layer 108, which is disposed on the dielectric layer 106 in the active device region 101*a*. The resistor structure 158 includes a first resistor layer 160, which is the metal-containing layer 108, and a second resistor layer 162, which is the semiconductor material 110. The resistor structure 158 may be disposed on the dielectric layer 106 in the passive device region 101*p*. As shown in FIG. 32, the first resistor layer 160 may include a sidewall that is substantially aligned with a sidewall of the second resistor layer 162.

Figure 33:
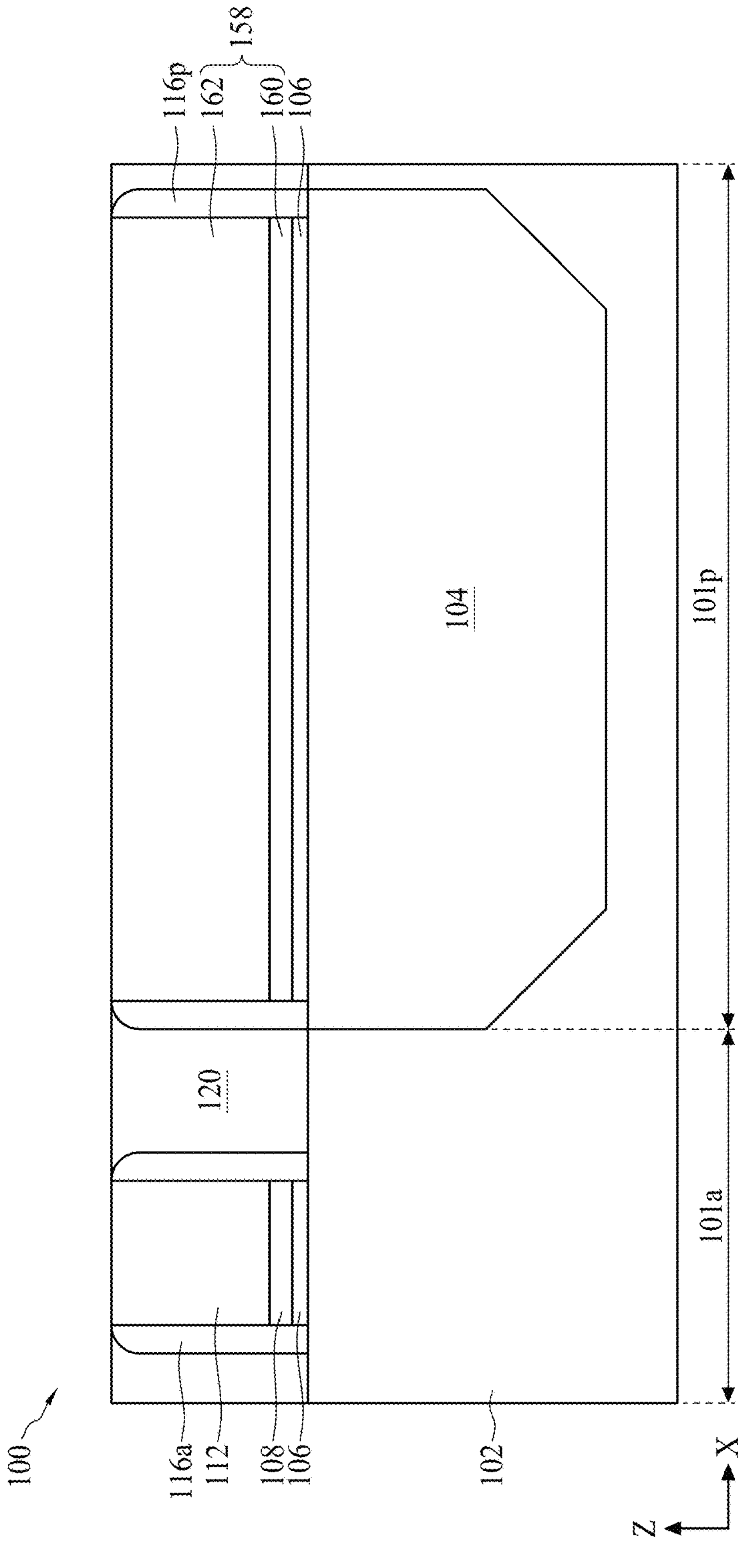
Figure 34:
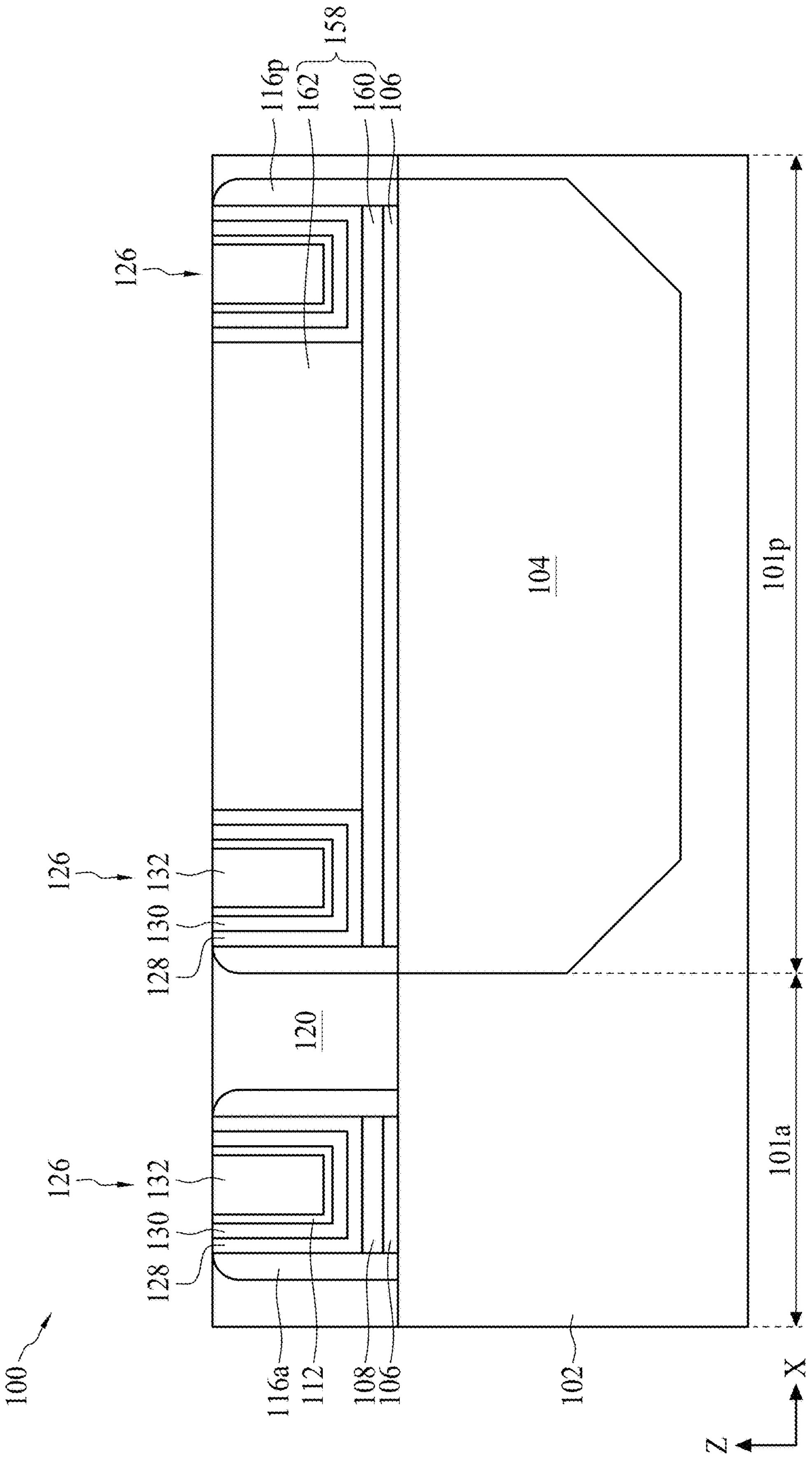

As shown in FIG. 33, the spacers 116*a*, 116*p* and the ILD layer 120 are formed. The CESL (not shown) may be formed between the substrate 102 and the ILD layer 120 and between the spacers 116*a*, 116*p* and the ILD layer 120. Next, as shown in FIG. 34, the sacrificial gate electrode 112 is replaced with the gate structure 126 including the work function layers 128, 130 and the gate electrode 132. In some embodiments, the gate structures 126 are also formed in the passive device region 101*p*, as shown in FIG. 34. In some embodiments, the gate structures 126 are not formed in the passive device region 101*p*, as shown in FIG. 9.

Figure 35:
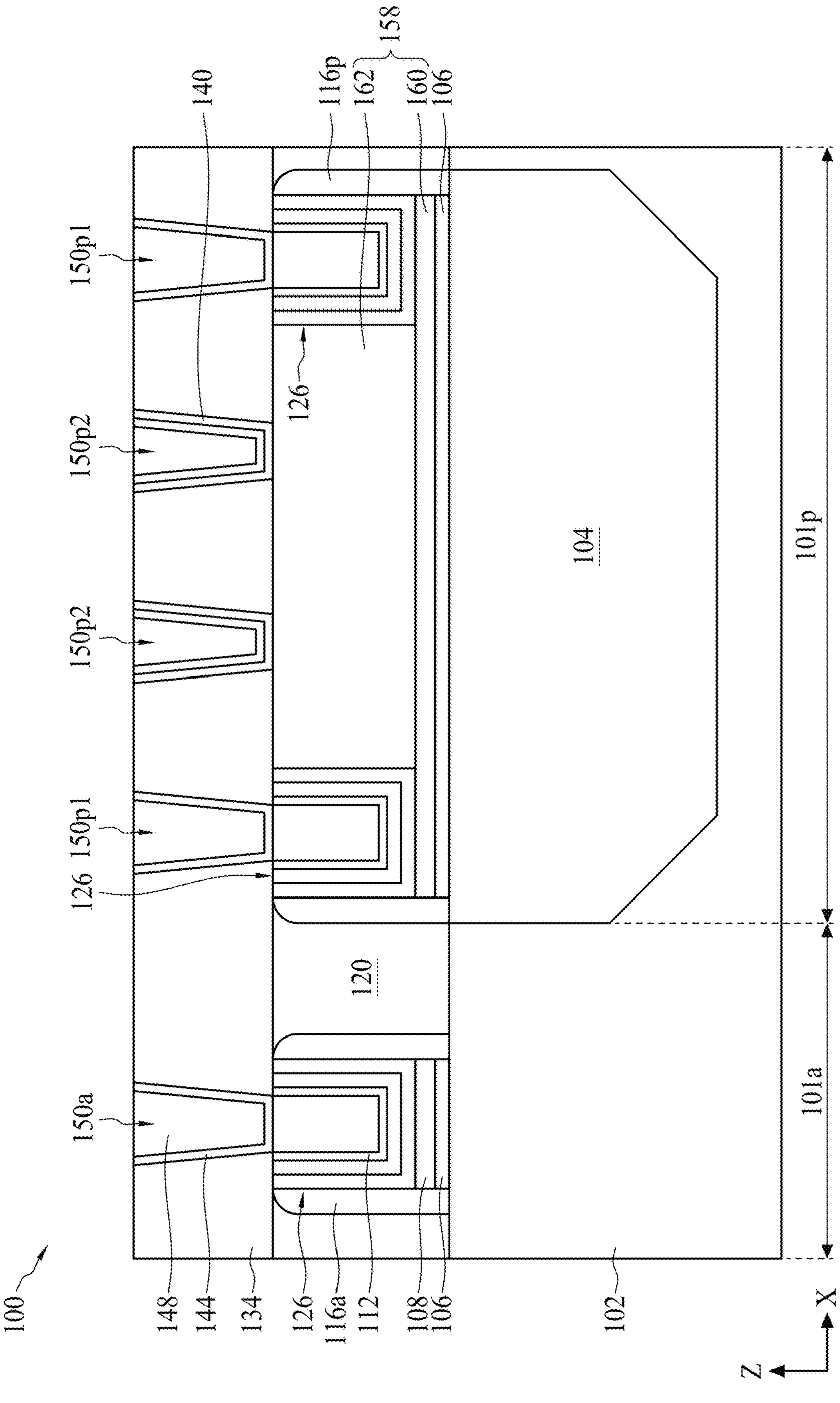
Figure 36:
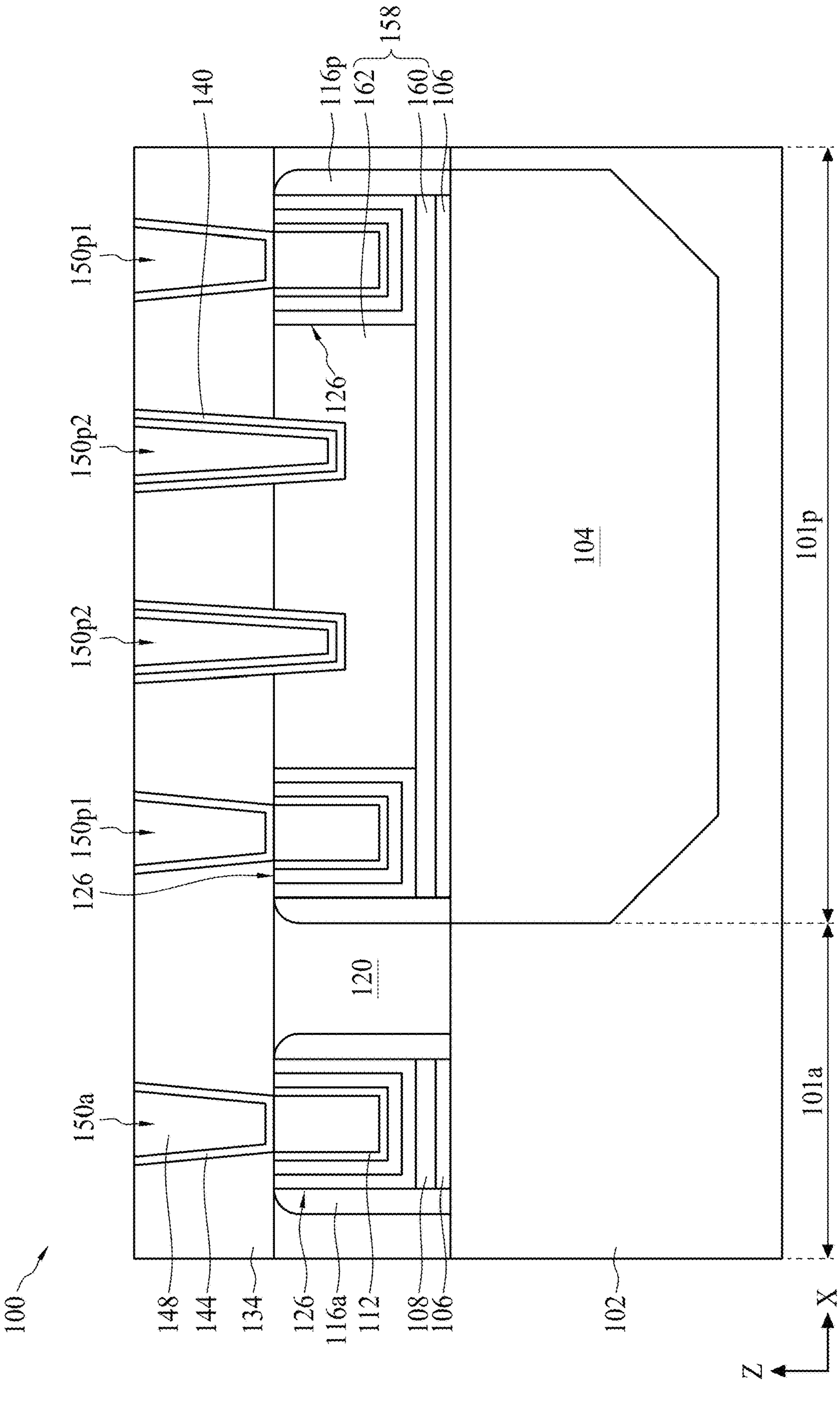
Figure 37:
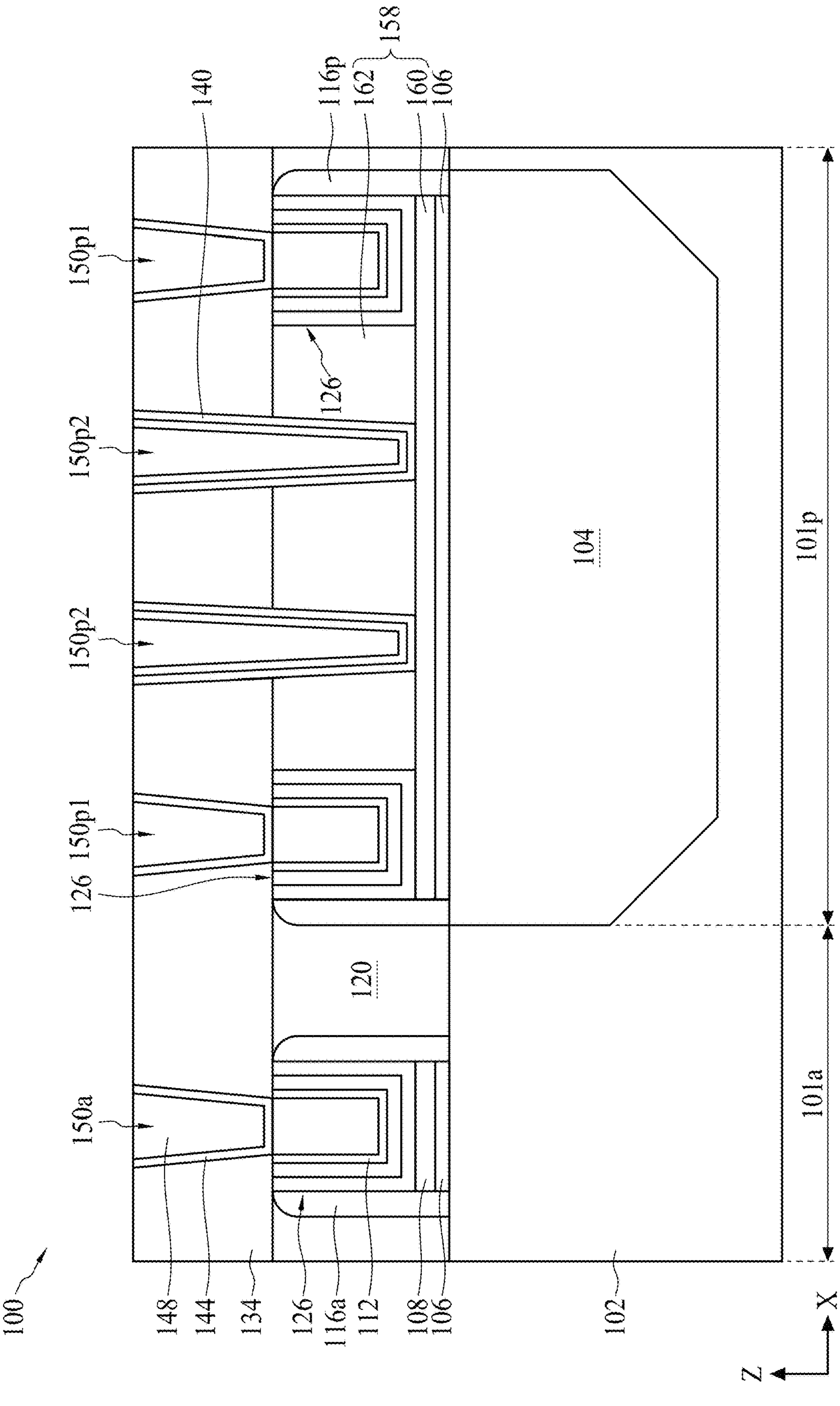
Figure 38:
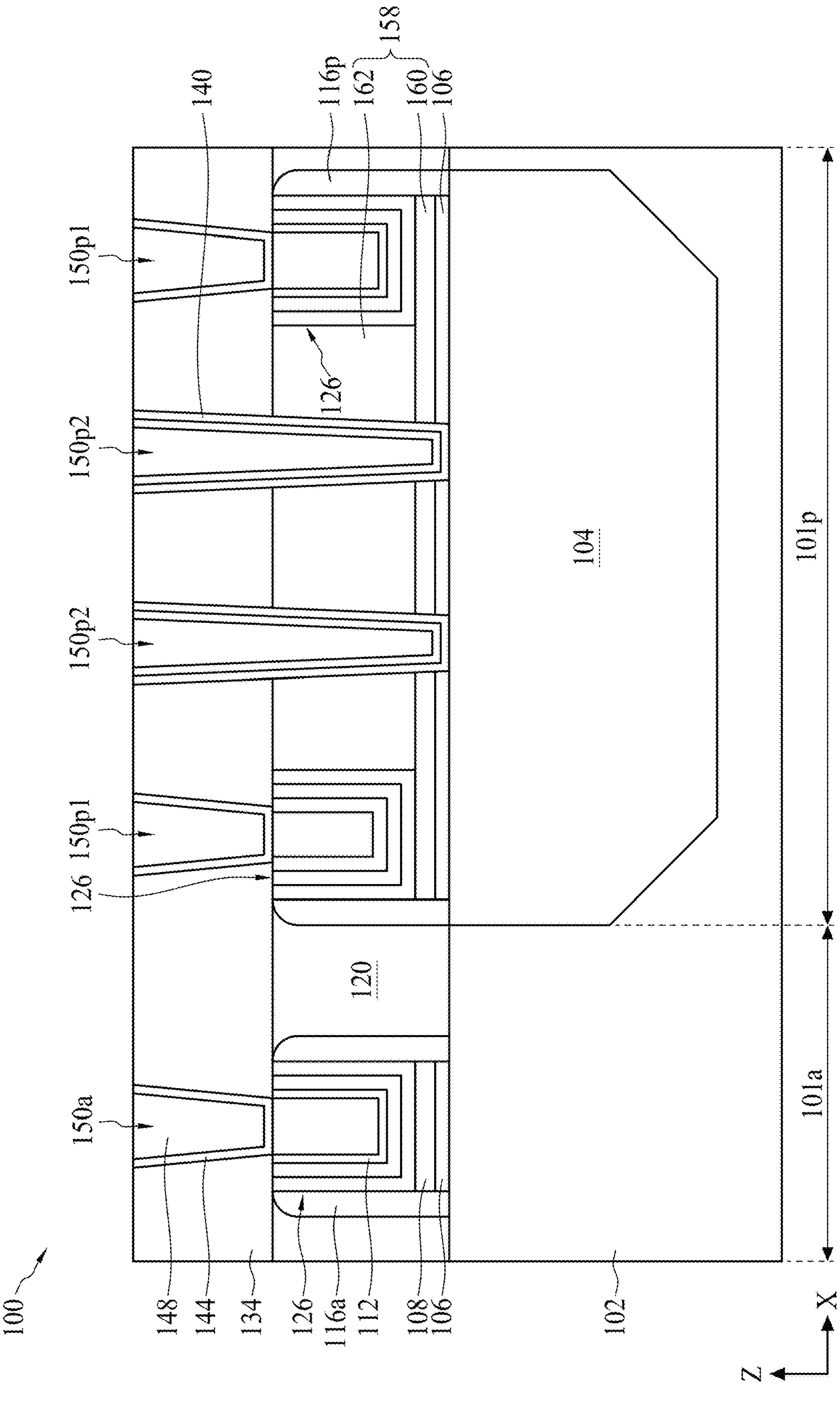

As shown in FIG. 35, the second ILD layer 134, the dielectric layer 140, and the conductive contacts 150*a*, 150*p*1, 150*p*2 are formed over the first ILD layer 120, the gate structures 126, and the second resistor layer 162. In some embodiments, the first resistor layer 160 is a first resistor device, and the second resistor layer 162 is a second resistor device. The conductive contacts 150*p*1 are in contact with the gate electrodes 132 located in the passive device region 101*p*, and the gate structures 126 located in the passive device regions 101*p* provide a path for a current to flow through the first resistor layer 160 and the second resistor layer 162. Thus, in some embodiments, the first resistor device (i.e., the first resistor layer 160) and the second resistor device (i.e., the second resistor layer 162) are connected in parallel. The conductive contacts 150*p*2 may be utilized to tune the resistance of both the first resistor layer 160 and the second resistor layer 162. In some embodiments, the conductive contacts 150*p*2 and the dielectric layer 140 are disposed on the second resistor layer 162, as shown in FIG. 35. In some embodiments, the conductive contacts 150*p*2 and the dielectric layer 140 extend into the second resistor layer 162, as shown in FIG. 36. In some embodiments, the conductive contacts 150*p*2 and the dielectric layer 140 extend through the second resistor layer 162, as shown in FIG. 37. In some embodiments, the conductive contacts 150*p*2 and the dielectric layer 140 extend through the first resistor layer 160, as shown in FIG. 38.

Figure 39:
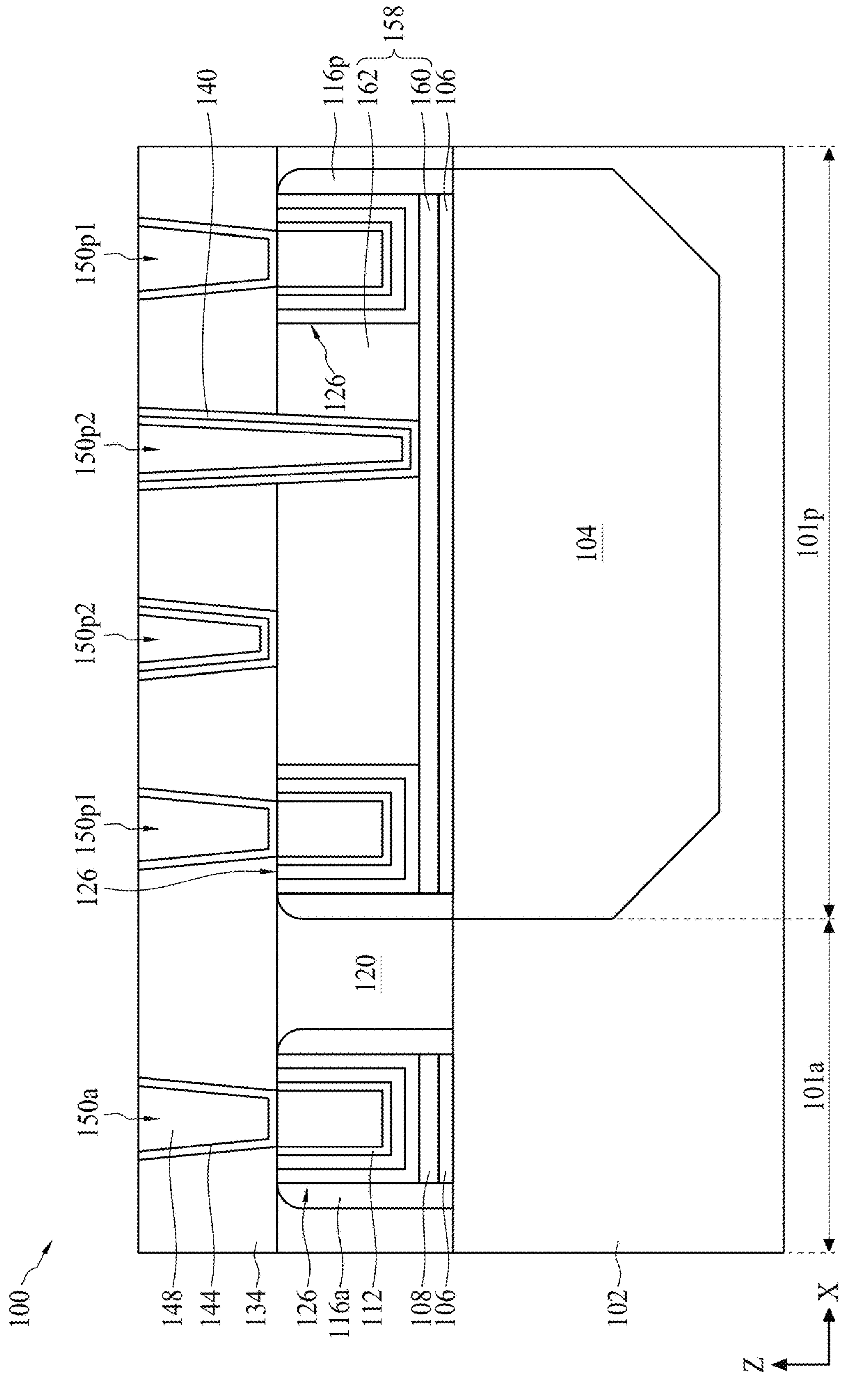

In some embodiments, to tune the resistance of the first and second resistor layers 160, 162 independently, the conductive contacts 150*p*2 and the dielectric layer 140 may have different depths, as shown in FIG. 39. In some embodiments, a first conductive contact 150*p*2 and the dielectric layer 140 is disposed on the second resistor layer 162 to tune the resistance thereof, and a second conductive contact 150$p$2 and the dielectric layer is disposed through the second resistor layer 162 to tune the resistance of both the first and second resistor layers 160, 162. In some embodiments, the first conductive contact 150$p$2 and the dielectric layer 140 may be extended into the second resistor layer 162. In some embodiments, the second conductive contact 150$p$2 and the dielectric layer 140 may be extended into or through the first resistor layer 160.

Embodiments of the present disclosure provide the semiconductor device structure 100 and the methods of forming the same. In some embodiments, the semiconductor device structure 100 includes a passive device region 101$p$ having a resistor structure 114 and one or more conductive contacts 150$p$2 to tune the resistance of the resistor structure 114. The formation of the resistor structure 114 and the conductive contacts 150$p$2 may be integrated with the formation of FETs in an active device region 101$a$. Some embodiments may achieve advantages. For example, the resistance of the resistor structure 114 may have a broader range with the conductive contacts 150$p$2.

An embodiment is a semiconductor device structure. The structure includes a first gate structure disposed over a substrate in an active device region, an insulating material disposed over the substrate in a passive device region, a resistor structure disposed over the insulating material in the passive device region, a first conductive contact electrically connected to the resistor structure, a second conductive contact disposed over the resistor structure, and a dielectric layer in contact with the second conductive contact and the resistor structure.

Another embodiment is a semiconductor device structure. The structure includes an insulating material disposed over a substrate, a resistor structure disposed over the insulating material, and first and second spacers disposed over the insulating material. The resistor structure is disposed between the first and second spacers. The structure further includes a first conductive contact electrically connected to the resistor structure, a second conductive contact extending into the resistor structure, and a first dielectric layer extending into the resistor structure. The first dielectric layer is in contact with the second conductive contact and the resistor structure.

A further embodiment is a method. The method includes depositing a metal-containing layer over a substrate in an active device region and a passive device region, depositing a semiconductor material in the active device region and the passive device region, patterning the semiconductor material to form a sacrificial gate electrode in the active device region and a resistor structure in the passive device region, replacing the sacrificial gate electrode with a gate structure in the active device region, and forming an interlayer dielectric layer over the gate structure and the resistor structure. The interlayer dielectric layer includes a first opening to expose a gate electrode of the gate structure, a second opening to expose a first portion of the resistor structure, and a third opening to expose a second portion of the resistor structure. The method further includes depositing a dielectric layer in the first, second, and third openings, removing portions of the dielectric layer in the first and second openings, and forming first, second, and third conductive contacts in the first, second, and third openings, respectively. The dielectric layer is disposed between the third conductive contact and the resistor structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
- depositing a metal-containing layer over a substrate in an active device region and a passive device region;
- depositing a semiconductor material in the active device region and the passive device region;
- patterning the semiconductor material to form a sacrificial gate electrode in the active device region and a resistor structure in the passive device region;
- replacing the sacrificial gate electrode with a gate structure in the active device region;
- forming an interlayer dielectric layer over the gate structure and the resistor structure, wherein the interlayer dielectric layer includes a first opening to expose a gate electrode of the gate structure, a second opening to expose a first portion of the resistor structure, and a third opening to expose a second portion of the resistor structure;
- depositing a dielectric layer in the first, second, and third openings;
- removing portions of the dielectric layer in the first and second openings; and
- forming first, second, and third conductive contacts in the first, second, and third openings, respectively, wherein the dielectric layer is disposed between the third conductive contact and the resistor structure.

2. The method of claim 1, further comprising forming a silicide layer between the second conductive contact and the resistor structure.

3. The method of claim 1, further comprising removing a portion of the metal-containing layer disposed in the passive device region prior to depositing the semiconductor material.

4. The method of claim 1, further comprising extending the third opening into the resistor structure.

5. A method, comprising:
- forming a resistor structure in a passive device region;
- forming a gate structure in an active device region;
- depositing an interlayer dielectric layer over the gate structure and the resistor structure;
- forming a first opening in the interlayer dielectric layer to expose a gate electrode of the gate structure, a second opening in the interlayer dielectric layer to expose a first portion of the resistor structure, and a third opening in the interlayer dielectric layer to expose a second portion of the resistor structure;
- depositing a dielectric layer in the first, second, and third openings;
- removing portions of the dielectric layer in the first and second openings; and
- forming a first seed layer in the first opening on the exposed gate electrode, a second seed layer in the second opening on the exposed first portion of the resistor structure, and a third seed layer in the third opening on the dielectric layer.

6. The method of claim 5, further comprising reacting the second seed layer with the resistor structure to form a silicide layer.

7. The method of claim 5, wherein the gate structure is formed after the formation of the resistor structure.

8. The method of claim 7, further comprising forming a sacrificial gate electrode in the active region prior to the forming of the gate structure.

9. The method of claim 8, further comprising forming first spacers on sidewalls of the sacrificial gate electrode and second spacers on sidewalls of the resistor structure.

10. The method of claim 9, wherein the gate structure is formed between the first spacers.

11. The method of claim 5, further comprising forming a first conductive material in the first opening, a second conductive material in the second opening, and a third conductive material in the third opening.

12. The method of claim 11, wherein the first conductive material and the first seed layer comprises a same material, the second conductive material and the second seed layer comprises a same material, and the third conductive material and the third seed layer comprises a same material.

13. A method, comprising:

forming an insulating material in a substrate;

depositing a semiconductor material over the substrate and the insulating material;

patterning the semiconductor material to form a sacrificial gate electrode over the substrate and a resistor structure over the insulating material;

depositing a first interlayer dielectric layer between the sacrificial gate electrode and the resistor structure;

replacing the sacrificial gate electrode with a gate structure;

depositing a second interlayer dielectric layer over the gate structure and the resistor structure;

depositing a dielectric layer over the gate structure, a first portion of the resistor structure, and a second portion of the resistor structure;

removing portions of the dielectric layer over the gate structure and the first portion of the resistor structure; and forming a first conductive contact on the gate structure, a second conductive contact on the first portion of the resistor structure, and a third conductive contact on the dielectric layer.

14. The method of claim 13, wherein the first conductive contact is formed interfacing the gate electrode, the second conductive contact is formed interfacing a silicide layer interfacing the first portion of the resistor structure, and the third conductive feature is formed interfacing the dielectric layer.

15. The method of claim 14, wherein the dielectric layer surrounds the third conductive contact.

16. The method of claim 15, wherein the first and second conductive contacts interface the second interlayer dielectric layer.

17. The method of claim 13, further comprising forming a metal-containing layer over the substrate, wherein the gate structure is formed over the metal-containing layer.

18. The method of claim 17, the metal-containing layer comprises TiN or TaN.

19. The method of claim 18, wherein the semiconductor material comprises polysilicon.

20. The method of claim 13, wherein the resistor structure interfaces the insulating material.

* * * * *